US012266546B2

(12) United States Patent
Ha et al.

(10) Patent No.: US 12,266,546 B2
(45) Date of Patent: Apr. 1, 2025

(54) UNIT FOR SUPPLYING LIQUID, APPARATUS AND METHOD FOR TREATING SUBSTRATE WITH THE UNIT

(71) Applicant: SEMES CO., LTD., Cheonan-si (KR)

(72) Inventors: Do Gyeong Ha, Daegu (KR); Tae Suk Yun, Cheonan-si (KR); Moon Soon Choi, Cheonan-si (KR); Gu Yeol An, Busan (KR); Chae Young Lim, Cheonan-si (KR); Bu Young Jung, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 55 days.

(21) Appl. No.: 17/969,155

(22) Filed: Oct. 19, 2022

(65) Prior Publication Data
US 2023/0131576 A1    Apr. 27, 2023

(30) Foreign Application Priority Data

Oct. 21, 2021  (KR) .................. 10-2021-0140906

(51) Int. Cl.
*H01L 21/67* (2006.01)
(52) U.S. Cl.
CPC .. *H01L 21/67051* (2013.01); *H01L 21/67057* (2013.01); *H01L 21/67103* (2013.01)
(58) Field of Classification Search
CPC ......... H01L 21/67017; H01L 21/67051; H01L 21/67057; H01L 21/67103; H01L 21/67253
See application file for complete search history.

(56) References Cited

U.S. PATENT DOCUMENTS

2020/0070196 A1* 3/2020 Kamimura .............. B05B 14/00
2020/0135515 A1* 4/2020 Nonaka ............... H01L 21/6708

FOREIGN PATENT DOCUMENTS

| JP | 2000-294532 A | 10/2000 |
|----|---------------|---------|
| JP | 2004-275917 A | 10/2004 |
| JP | 2010-232520 A | 10/2010 |

(Continued)

OTHER PUBLICATIONS

Japanese Office Action dated Nov. 21, 2023, issued in corresponding Japanese Patent Application No. 2022-166044.

(Continued)

*Primary Examiner* — Douglas Lee
(74) *Attorney, Agent, or Firm* — Harness, Dickey & Pierce, P.L.C.

(57) ABSTRACT

The inventive concept provides a substrate treating apparatus. The substrate treating apparatus includes a support unit configured to support a substrate; and a liquid supply unit configured to supply a treating liquid onto the substrate supported on the support unit, and wherein the liquid supply unit comprises: a tank configured to have an accommodation space for storing the treating liquid therein; a circulation line configured to circulate the treating liquid stored in the accommodation space; a supplementary line configured to supply the treating liquid to the accommodation space, and at which a valve is installed; a heater installed at the circulation line, and for heating the treating liquid; and a controller is configured to control the valve and the heater.

20 Claims, 12 Drawing Sheets

(56) References Cited

FOREIGN PATENT DOCUMENTS

| JP | 2020-035920 A | 3/2020 |
| --- | --- | --- |
| KR | 10-1997-0018174 A | 12/1999 |
| KR | 10-2002-0024752 A | 4/2002 |
| KR | 10-2011-0082299 A | 7/2011 |
| WO | WO-2015119400 A | 8/2015 |

OTHER PUBLICATIONS

Korean Office Action dated Jun. 27, 2023 issued in corresponding Korean Patent Application No. 10-2021-0140906.

* cited by examiner

UNIT FOR SUPPLYING LIQUID, APPARATUS AND METHOD FOR TREATING SUBSTRATE WITH THE UNIT

CROSS-REFERENCE TO RELATED APPLICATIONS

A claim for priority under 35 U.S.C. § 119 is made to Korean Patent Application No. 10-2021-0140906 filed on Oct. 21, 2021, in the Korean Intellectual Property Office, the entire contents of which are hereby incorporated by reference.

BACKGROUND

Embodiments of the inventive concept described herein relate to a liquid supply unit, and a substrate treating apparatus and a substrate treating method having the same, more specifically, a substrate treating apparatus and a substrate treating method for supplying a liquid to a substrate, and a liquid supply unit used therein.

Pollutants such as particles, organic contaminants, or metal contaminants remaining on a surface of a substrate have a great influence on the characteristics and a production yield of a semiconductor element. Accordingly, a cleaning process of removing various contaminants attached to the surface of the substrate has an important meaning in a semiconductor manufacturing process. The cleaning process is performed before and after each unit process of manufacturing a semiconductor. The cleaning process includes a cleaning liquid treating process of removing contaminants remaining on the substrate using a cleaning liquid, a rinsing process of removing the cleaning liquid remaining on the substrate using a pure water, and a drying process of drying the substrate using an organic solvent, a supercritical fluid, or a nitrogen gas.

Various treating liquids used in the cleaning process require a certain range of temperatures. For this, an inline heating technology for heating the treating liquid in a pipe through which the treating liquid flows is generally used. The inline heating technology is a method of heating the treating liquid to circulate the treating liquid so that a temperature of the treating liquid is maintained within a certain range, and of discharging the treating liquid on the substrate whenever necessary. However, in in-line heating technology, after discharging a certain amount of the treating liquid on the substrate, there is a problem that a previously maintained temperature of treating liquid changes rapidly if the treating liquid is replenished. This issue results in a problem in that the temperature of the treating liquid is not supplied onto the substrate at a set temperature and that a treatment efficiency of the substrate is degraded.

SUMMARY

Embodiments of the inventive concept provide a liquid supply unit, and a substrate treating apparatus and a substrate treating method having the same for efficiently treating a substrate.

Embodiments of the inventive concept provide a liquid supply unit, and a substrate treating apparatus and a substrate treating method having the same for minimizing a rapid temperature change of a pre-stored treating liquid by a replenishing treating liquid while the treating liquid is being replenished.

Embodiments of the inventive concept provide a liquid supply unit, and a substrate treating apparatus and a substrate treating method having the same for maintaining a temperature of a treating liquid within a certain range.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a support unit configured to support a substrate; and a liquid supply unit configured to supply a treating liquid onto the substrate supported on the support unit, and wherein the liquid supply unit includes: a tank configured to have an accommodation space for storing the treating liquid therein; a circulation line configured to circulate the treating liquid stored in the accommodation space; a supplementary line configured to supply the treating liquid to the accommodation space, and at which a valve is installed; a heater installed at the circulation line, and for heating the treating liquid; and a controller for controlling the valve, and wherein the controller controls the valve to perform a supplementary operation of supplying the treating liquid to the accommodation space through the supplementary line if it is determined that a supplement of the treating liquid stored in the accommodation space is required, controls the valve to supply the treating liquid at a first supply amount per unit time to the accommodation space while a first period of the supplementary operation is being performed, controls the valve to supply the treating liquid at a second supply amount per unit time to the accommodation space while a second period of the supplementary operation is being performed, and wherein the first supply amount per unit time of the treating liquid is an average supply amount at an entire period of the first period, the second supply amount per unit time of the treating liquid is an average supply amount at an entire period of the second period, and the first period happens before the second period.

In an embodiment, an average supply amount per unit time of the treating liquid supplied during the first period is lower than an average supply amount per unit time of the treating liquid supplied at the second period.

In an embodiment, the controller controls the valve to perform a pulse operation of repeating an on operation and an off operation during the first period.

In an embodiment, the controller controls the valve to perform a pulse operation of repeating an on operation during the first period.

In an embodiment, the supplementary line branches to flow the treating liquid to a first supply member and a second supply member which each have a valve and a pipe, and a size of the valve or the pipe provided at the first supply member and the second supply member are different.

In an embodiment, a size of a first valve and a first pipe provided at the first supply member is relatively smaller than a size of a second valve and a second pipe provided at the second supply member.

In an embodiment, the controller controls the first valve to be on and the second valve to be off so the treating liquid is supplied to the accommodation space through the first supply member during the first period, and controls the second valve to be on during the second period.

In an embodiment, the valve is a flow rate adjusting valve.

In an embodiment, the substrate treating apparatus further includes a measurement unit for measuring a level of the treating liquid stored at the accommodation space, and wherein the controller determines a supplementary section at which the supplementary operation is performed by detecting the level of the treating liquid stored at the accommodation space which is measured by the measurement unit.

In an embodiment, the treating liquid stored at the accommodation space is continuously heated during a supplementary operation by the heater.

The inventive concept provides a liquid supply unit for supplying a treating liquid onto a substrate. The liquid supply unit includes a tank configured to have an accommodation space for storing the treating liquid therein; a circulation line configured to circulate the treating liquid stored in the accommodation space; a supplementary line configured to supply the treating liquid to the accommodation space, and at which a valve is installed; a heater installed at the circulation line, and for heating the treating liquid; and a controller for controlling the valve, and wherein the controller controls the valve to perform a supplementary operation of supplying the treating liquid to the accommodation space through the supplementary line if it is determined that a supplement of the treating liquid stored in the accommodation space is required, controls the valve to supply the treating liquid at a first supply amount per unit time to the accommodation space while a first period of the supplementary operation is being performed, controls the valve to supply the treating liquid at a second supply amount per unit time to the accommodation space while a second period of the supplementary operation is being performed, and wherein the first supply amount per unit time of the treating liquid is an average supply amount at an entire period of the first period, the second supply amount per unit time of the treating liquid is an average supply amount at an entire period of the second period, and the first period happens before the second period.

In an embodiment, an average supply amount per unit time of the treating liquid supplied during the first period is lower than an average supply amount per unit time of the treating liquid supplied at the second period.

In an embodiment, the controller controls the valve to perform a pulse operation of repeating an on operation and an off operation during the first period, and controls the valve to perform a pulse operation of repeating an on operation during the first period.

In an embodiment, the supplementary line branches to flow the treating liquid to a first supply member and a second supply member which each have a valve and a pipe, and a size of a first valve and a first pipe provided at the first supply member is relatively smaller than a size of a second valve and a second pipe provided at the second supply member.

In an embodiment, the controller controls the first valve to be on and the second valve to be off so the treating liquid is supplied to the accommodation space through the first supply member during the first period, and controls the second valve to be on during the second period.

In an embodiment, the valve is a flow rate adjusting valve.

The inventive concept provides a substrate treating method. The substrate treating method includes storing a treating liquid at an accommodation space inside a tank, heating the treating liquid stored in the accommodation space to a set temperature at a circulation line to flow within the circulation line, and discharging the treating liquid which is heated to the set temperature to a substrate to treat the substrate, performing a supplementary operation of supplying the treating liquid to the accommodation space if a supplement of the treating liquid stored at the accommodation space is required, supplying the treating liquid to the accommodation space in a first supply amount per unit time during a first period of the supplementary operation, and supplying the treating liquid to the accommodation space in a second supply amount per unit time during a second period of the supplementary operation, and wherein the first supply amount per unit time of the treating liquid is an average supply amount at an entire period of the first period, the second supply amount per unit time of the treating liquid is an average supply amount at an entire period of the second period.

In an embodiment, an average supply amount per unit time of the treating liquid supplied during the first period is lower than an average supply amount per unit time of the treating liquid supplied during the second period.

In an embodiment, the treating liquid is supplied to the accommodation space through a pulse operation of repeating an operation of supplying the treating liquid to the accommodation space and an operation of stopping a supply of the treating liquid during the first period, and the treating liquid is continuously supplied to the accommodation space during the second period.

In an embodiment, a supplementary line which supplies the treating liquid to the accommodation space flows the treating liquid to a first supply member and a second supply member which each have a valve and a pipe, a size of a first valve and a first pipe provided at the first supply member is relatively smaller than a size of a second valve and a second pipe provided at the second supply member, and the treating liquid is supplied to the accommodation space through the first supply member during the first period, and the treating liquid is supplied to the accommodation space through the second supply member during the second time.

According to an embodiment of the inventive concept, a substrate may be efficiently treated.

According to an embodiment of the inventive concept, a rapid temperature change of a pre-stored treating liquid by a replenishing treating liquid while the treating liquid is being replenished may be minimized.

According to an embodiment of the inventive concept, a temperature of a treating liquid may be maintained within a certain range.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
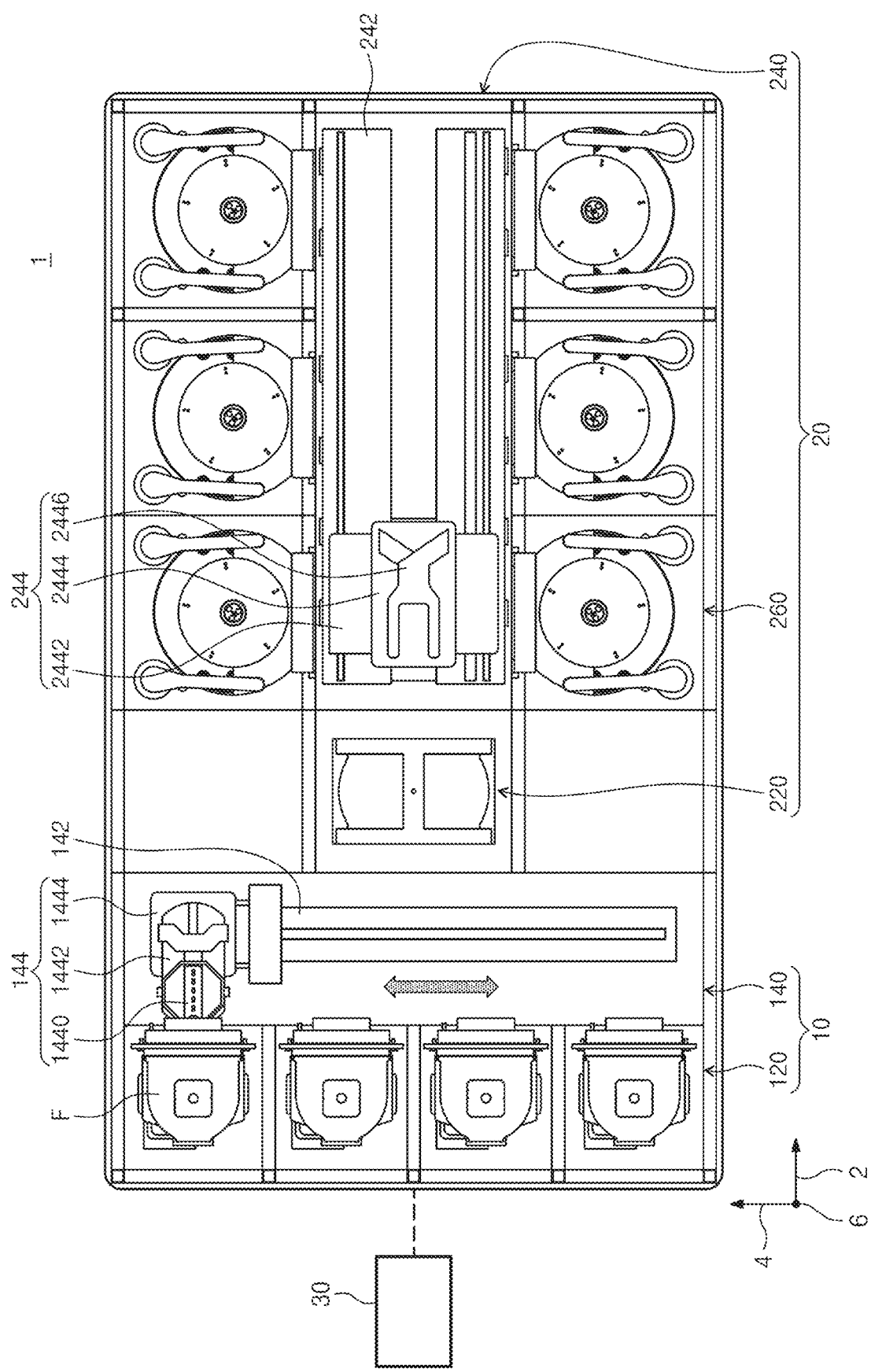
FIG. 1 schematically illustrates an embodiment of a substrate treating apparatus according to the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. The embodiment is provided to more fully explain the inventive concept to a person with average knowledge in the art. Therefore, the form of the components in the drawings is exaggerated to emphasize a clearer description.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

Hereinafter, an embodiment of the inventive concept will be described in detail with reference to FIG. 1 to FIG. 3. In the embodiment, a process of liquid treating a substrate by supplying a liquid such as a cleaning liquid onto the substrate will be described as an example. However, the embodiment is not limited to a cleaning process, and may be applied to various types of apparatuses for treating the substrate by supplying a liquid. For example, the embodiment may be applied to an apparatus which performs a process of coating a photoresist on the substrate and then develops the substrate after an exposure, and an apparatus which performs a process of removing a thin film from the substrate by supplying a chemical on the substrate.

FIG. 1 schematically illustrates a substrate treating apparatus according to an embodiment of the inventive concept. Referring to FIG. 1, the substrate treating apparatus 1 includes an index module 10 and a treating module 20. According to an embodiment, the index module 10 and the treating module 20 are disposed in a direction. Hereinafter, a direction in which the index module 10 and the treating module 20 are disposed is referred to as a first direction 2, a direction perpendicular to the first direction 2 when seen from above is referred to as a second direction 4, and a direction perpendicular to a plane including both the first direction 2 and the second direction 4 is defined as a third direction 6.

The index module 10 transfers the substrate W from a container F in which the substrate W is stored to the treating module 20 that treats the substrate W. The index module 10 receives the substrate W that has been treated at the treating module 20 and stores the substrate W at the container F. A lengthwise direction of the index module 10 is provided in the second direction 4. The index module 10 has a load port 120 and an index frame 140.

The container F in which the substrate W is stored is mounted on the load port 120. The load port 110 and the treating module are disposed on two opposite sides of the index frame 140. The load port 120 may be provided in a plurality, and the plurality of load ports 120 may be arranged in a direction along the second direction 4. The number of load ports 120 may increase or decrease according to a process efficiency and a foot print condition of the treating module 20.

A plurality of slots (not shown) are formed at the container F to store the substrates W in a state in which the substrates W are horizontally arranged with respect to the ground. As the container F, a sealed container such as a front opening unified pod (FOUP) may be used. The container F may be placed on the load port 120 by a transfer means (not shown) such as an overhead transfer, an overhead conveyor, or an automatic guided vehicle, or by an operator.

An index rail 142 and an index robot 144 are provided within the index frame 140. The index rail 142 is provided with its lengthwise direction along the second direction 4 within the index frame 140. The index robot 144 may transfer the substrate W. The index robot 144 may transfer the substrate W between the index module 10 and the buffer chamber 240 to be described later.

The index robot 144 may include an index hand 1440. The substrate W may be placed on the index hand 1440. The index hand 1440 may include an index base 1442 having an annular ring form in which a part of the circumference is symmetrically cut-out, and an index support unit 1444 for moving the index base 1442. A configuration of the index hand 1440 is the same as or similar to a configuration of a transfer hand 2240 to be described later. The index hand 1440 may be provided to be movable along the second direction 4 along the index rail 142. Accordingly, the index hand 1440 may forwardly and backwardly move along the index rail 142. In addition, the index hand 1440 may be provided to be rotatable with the third direction 6 as an axis, and movable along the third direction 6.

The controller may control the substrate treating apparatus. The controller 30 may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The controller 30 may control the substrate treating apparatus 1 to perform a substrate treating method to be described below. For example, the controller may control the components provided at a liquid supply unit to be described below to perform the substrate treating method described below.

The treating module 20 includes a buffer unit 220, a transfer chamber 240, and a process chamber 260. The buffer unit 220 provides a space in which a substrate W taken into the treating module 20 and a substrate W taken out from the treating module 20 temporarily remain. The transfer chamber 240 provides a space for transferring the substrate W between the buffer unit 220 and the process chamber 260 and between the process chambers 260. The process chamber 260 may perform a liquid treating process of treating the substrate W by supplying a liquid onto the substrate W. For example, the liquid treating process may be a cleaning process of cleaning the substrate with a cleaning liquid. A chemical treatment, a rinsing treatment, and a drying treatment may all be performed on the substrate within the process chamber 260. Optionally, a process chamber 260 for drying the substrate may be provided separately from a process chamber 260 for performing a liquid treatment.

The buffer unit 220 may be disposed between the index frame 140 and the transfer chamber 240. The buffer unit 220 may be positioned at an end of the transfer chamber 240. A slot (not shown) on which the substrate W is placed is provided inside the buffer unit 220. A plurality of slots (not shown) are provided to be spaced apart from each other along the third direction 6. A front face and a rear face of the buffer unit 220 are opened. The front face is a surface facing the index module 10, and the rear face may be a surface facing the transfer chamber 240. The index robot 144 may access the buffer unit 220 through the front face, and the transfer robot 244, which will be described later, may access the buffer unit 220 through the rear face.

A lengthwise direction of the transfer chamber 240 may be provided in the first direction 2. Each of the process chambers 260 may be disposed on both sides of the transfer chamber 240. The process chamber 260 may be disposed at a side of the transfer chamber 240. The process chamber 260 and the transfer chamber 240 may be disposed along the second direction 4.

According to an embodiment, the process chambers 260 may be disposed on both sides of the transfer chamber 240, and the process chambers 260 may be provided in an arrangement of A×B (A and B are natural numbers greater than 1 or 1) along the first direction 2 and the third direction 6, respectively. Here, A is the number of process chambers 260 provided in a row along the first direction 2, and B is the number of process chambers 260 provided in a row along the third direction 6. When four or six process chambers 260 are provided at a side of the transfer chamber 240, the process chambers 260 may be arranged in an arrangement of 2×2 or 3×2. The number of the process chambers 260 may increase or decrease. Unlike the above, the process chamber 260 may be provided only at a side of the transfer chamber 240. In addition, the process chamber 260 may be provided as a single layer at a side and at both sides of the transfer chamber 240.

The transfer chamber 240 includes a guide rail 242 and a transfer robot 244. The guide rail 242 is provided with its lengthwise direction in the first direction 2 within the transfer chamber 240. The transfer robot 244 may be provided to be linearly movable along the first direction 2 on the guide rail 242. The transfer robot 244 transfers the substrate W between the buffer unit 220 and the process chamber 260 and between the process chambers 260.

The transfer robot 2440 includes a base 2442, a body 2444, and an arm 2446. The base 2442 is installed to be movable in the first direction 2 along the guide rail 242. The body 2444 is coupled to the base 2442. The body 2444 is provided to be movable along the third direction 6 on the base 2442. In addition, the body 2444 is provided to be rotatable on the base 2442. The arm 2446 is coupled to the body 2444, which is provided to be forwardly and backwardly movable with respect to the body 2444. The arm 2446 is provided in a plurality to be driven individually, respectively. The arms 2446 are disposed to be stacked on each other and spaced apart from each other along the third direction 6.

The process chamber 260 performs a liquid treating process on the substrate W. For example, the process chamber 260 may be a chamber that performs a cleaning process by supplying the cleaning liquid to the substrate W. Unlike this, the process chamber 260 may be a chamber that performs a wet etching process of removing a thin film on the substrate by supplying a liquid plasma. The process chamber 260 may have a different structure depending on a type of a process for treating the substrate W. Alternatively, each of the process chambers 260 may have a same structure. Selectively, the process chambers 260 may be divided into a plurality of groups, and the process chambers 260 belonging to one of the groups may be process chambers 260 performing any one of the cleaning process and the wet etching process, and process chambers 260 belong to another one of the groups may be process chambers 260 performing any one of the cleaning process and the wet etching process.

In the embodiment of the inventive concept, a case in which a liquid treatment process of treating the substrate W by supplying a treating liquid to the substrate W in the process chamber 260 will be described as an example. The treating liquid according to an embodiment of the inventive concept may be any one of a chemical, a rinsing liquid, and an organic solvent. The chemicals may include a diluted sulfuric acid peroxide ($H_2SO_4$), a phosphoric acid ($P_2O_5$), a hydrofluoric acid (HF), and an ammonium hydroxide ($NH_4OH$). For example, the rinsing liquid may include a water or a deionized water (DIW). For example, the organic solvent may include an alcohol such as an isopropyl alcohol (IPA). Hereinafter, for convenience of description, a case in which the treating liquid supplied to the substrate W is a chemical will be described as an example.

Figure 2:
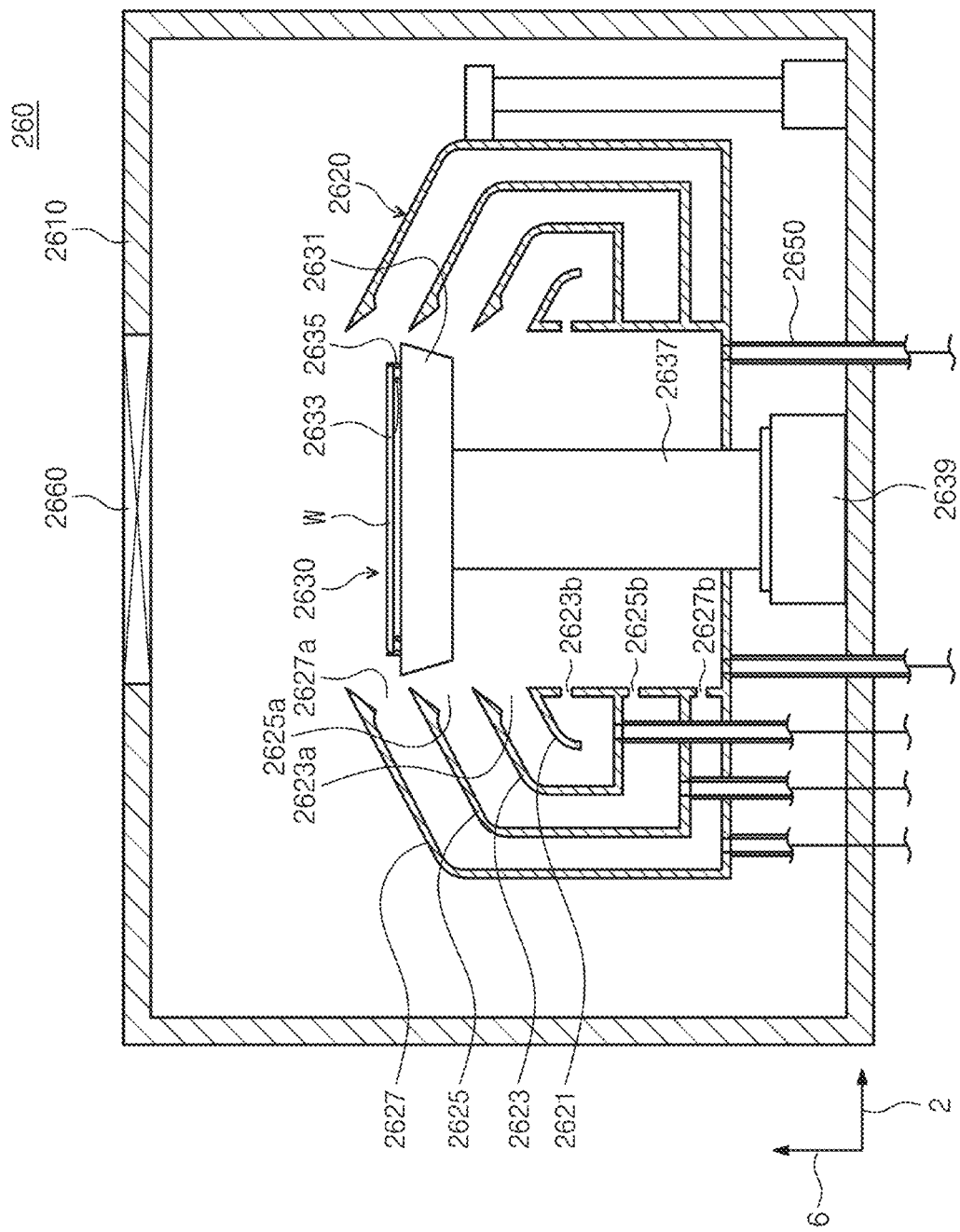
FIG. 2 schematically illustrates an embodiment of a process chamber of FIG. 1.

FIG. 2 schematically illustrates an embodiment of the process chamber of FIG. 1. Referring to FIG. 2, the process chamber 260 includes a housing 2610, a treating container 2820, and a support unit 2830.

The housing 2610 has a space therein. The housing 2610 has generally a rectangular parallelepiped form. At a side of the housing 2610 an opening may be formed. The opening may function as an entrance at which the substrate W is taken into the inner space or the substrate W is taken out of the inner space. The treating container 2620 and the support unit 2630 are disposed within the housing 2610.

The treating container 2620 has a treating space with an open top. The treating container 2620 may be a bowl having the treating space. The treating container 2620 may be provided to surround the treating space. The treating space of the treating container 2620 may be a space in which the support unit 2630 to be described later supports and rotates the substrate W. The treating space may be a space in which the substrate W is treated by supplying the treating liquid to the substrate W by the liquid supply unit to be described later.

According to an embodiment, the treating container 2620 may have a guide wall 2621 and a plurality of recollecting containers 2623, 2625, and 2627. Each of the recollecting containers 2623, 2625, and 2627 separates and recollects different treating liquids from the treating liquids used for the substrate treatment. Each of the recollecting containers 2623, 2625, and 2627 has a recollecting space for recollecting the treating liquid used for the substrate treatment. The guide wall 2621 and each of the recollecting containers 2623, 2625, and 2627 are provided in an annular ring form surrounding the support unit 2630. When the liquid treating process is performed, a treating liquid scattered by the rotation of the substrate W is introduced into the recollecting space through inlets 2623*a*, 2625*a*, and 2627*a* to be described later of the recollecting containers 2623, 2625, and 2627 respectively. Different types of the treating liquid may flow into each recollecting container.

According to an embodiment, the treating container 2620 has the guide wall 2621, the first recollecting container 2623, the second recollecting container 2625 and the third recollecting container 2627. The guide wall 2621 is provided in an annular ring form surrounding the support unit 2630, and the first recollecting container 2623 is provided in an annular ring form surrounding the guide wall 2621. The second recollecting container 2625 is provided in an annular ring form surrounding the first recollecting container 2623, and the third recollecting container 2627 is provided in an annular ring form surrounding the second recollecting container 2625. A space between the first recollecting container 2623 and the guide wall 2621 functions as a first inlet 2623*a* through which a liquid is treating introduced. A space between the first recollecting container 2623 and the second recollecting container 2625 functions as a second inlet 2625*a* through which a treating liquid is introduced. A space between the second recollecting container 2625 and the third recollecting container 2627 functions as a third inlet 2627*a* through which a treating liquid is introduced. The second inlet 2625*a* is positioned above the first inlet 2623*a*, and the third inlet 2627*a* can be positioned above the second inlet 2625*a*.

A space between a lower end of the guide wall 2621 and the first recollecting container 2623 functions as a first outlet 2623*b* through which a fume and an airflow generated from the treating liquid are discharged. A space between a lower end of the first recollecting container 2623 and the second recollecting container 2625 functions as a second outlet 2625*b* through which the fume and the airflow generated from the treating liquid are discharged. A space between a lower end of the second recollecting container 2625 and the third recollecting container 2627 functions as a third outlet 2627*b* through which the fume and the airflow generated from the treating liquid are discharged. The fume and the airflow discharged from the first outlet 2623*b*, the second outlet 2625*b*, and the third outlet 2627*b* are exhausted through an exhaust unit 2650 to be described later.

The recollecting lines (not shown) extending vertically in a bottom direction of a bottom surface are connected to each recollecting container 2623, 2625, 2627.

The support unit supports and rotates the substrate W in the treating space. The support unit 2630 may have a spin chuck 2631, a support pin 2633, a chuck pin 2635, a rotation shaft 2637, and a first driver 2639.

The spin chuck 2631 has a top surface, which is generally a circular form when viewed from above. The top surface of the spin chuck 2631 may have a diameter larger than that of the substrate W.

The support pin 2633 may be provided in a plurality. The support pins 2633 are disposed at an edge portion of the top surface of the spin chuck 2631 to be spaced apart from each other at a predetermined interval with defining an annular ring, and upwardly protrude from the spin chuck 2631. The support pins 2633 support an edge of rear surface of the substrate W such that the substrate W is spaced apart from the top surface of the spin chuck 2631 by a predetermined distance.

The chuck pin 2635 may be provided in a plurality. The chuck pins 2635 are disposed to be farther from a center of the spin chuck 2631 than the support pin 2633. The chuck pins 2635 protrude from the top surface of the spin chuck 2631. The chuck pins 2635 support a side portion of the substrate W so that the substrate W does not laterally shift or sway when the substrate W is rotated. The chuck pins 2635 are movable between a standby position and a support position along a radial direction of the spin chuck 2631. The standby position is a position far from the center of the spin chuck 2631 compared to the support position. When the substrate W is loaded or unloaded on the support unit 2630, the chuck pin 2635 is positioned at the standby position, and when a process is performed on the substrate W, the chuck pin 2635 is positioned at the support position to support the substrate W and to block lateral shifting or swaying of the substrate W. At the support position, the chuck pins 2635 are in contact with the side of the substrate W.

The rotation shaft 2637 is coupled to the spin chuck 2631. The rotation shaft 2637 may be coupled to a bottom surface of the spin chuck 2631. The rotation shaft 2637 is provided to be rotatable by receiving a power from the driver 2639. The driver 2639 rotates the rotation shaft 2637, thereby rotating the spin chuck 2631. The driver 2639 may vary a rotation speed of the rotation shaft 2637. The driver 2639 may be a motor that provides a driving force. However, the inventive concept is not limited thereto, and may be variously modified as a known device that provides a driving force.

The lifting/lowering unit 2640 is disposed in the housing 2610. The lifting/lowering unit 2640 adjusts a relative height between the treating space 2620 and the support unit 2630. The lifting/lowering unit 2640 linearly moves the treating container 2620 in the third direction 6.

The exhaust line 2650 exhausts the fume and the gas generated in the treating space. The exhaust line 2650 exhausts the fume and the gas generated when the substrate W is liquid-treated. The exhaust line 2650 may be coupled to a bottom surface of the treating container 2620. In an embodiment, the exhaust line 2650 may be positioned between the rotation shaft 2637 of the support unit 2630 and an inner wall of the treating container 2620. A depressurizing unit (not shown) is provided at the exhaust line 2650. The fume and the gas generated during a liquid treatment of the substrate W by the depressurizing unit are exhausted from the treating space to an outside of the treating space.

The airflow supply unit 2660 supplies an airflow to the inner space of the housing 2610. The airflow supply unit 2660 may supply a downward airflow to the inner space. The airflow supply unit 2660 may be installed at the housing 2610. The airflow supply unit 2660 may be installed above the treating container 2620 and the support unit 2630. A gas supplied to the inner space of the housing 2610 through the airflow supply unit 2660 forms a downward airflow in the inner space. The gas by-products generated by the treating process within the treating space are discharged to an outside of the housing 2610 through the exhaust line 2650 by the downward airflow. The airflow supply unit 2660 may be provided as a fan filter unit.

Figure 3:
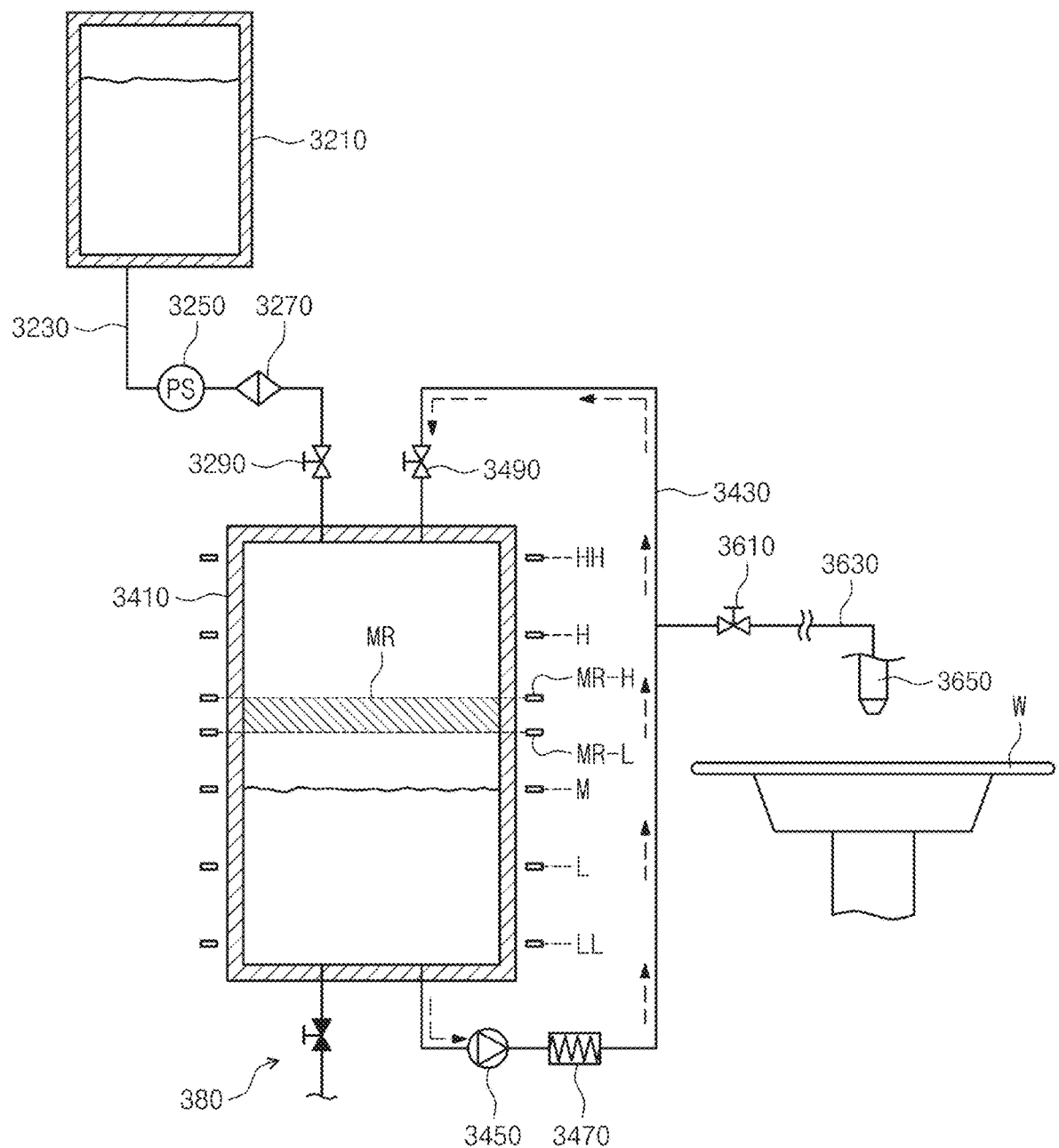
FIG. 3 schematically illustrates an embodiment of a liquid supply unit of FIG. 1.

FIG. 3 schematically illustrates an embodiment of the liquid supply unit of FIG. 1. Referring to FIG. 3, the liquid supply unit may supply a liquid to the substrate W positioned in the process chamber 260. The liquid supply unit 300 may supply the treating liquid to the substrate W supported by the support unit 2630. In an embodiment, the liquid supplied by the liquid supply unit to the substrate W may be a chemical.

The liquid supply unit may include a supplementary unit, a circulation unit, a supply unit, and a discharge unit 380. The supplementary unit stores the treating liquid and supplies the treating liquid to a circulation tank 3410 to be described later. The circulation unit heats the treating liquid stored in the circulation tank 3410 and circulates the heated treating liquid to a circulation line 3430 to be described later. The supply unit supplies the treating liquid flowing through the circulation line 3430 onto the substrate W. The discharge unit 380 may discharge the treating liquid flowing through the circulation line 3430 to an outside of the liquid supply unit.

The supplementary unit may include a treating liquid supply source 3210, a supplementary line 3230, a pressure sensor 3250, a filter 3270, and a valve 3290. The treating liquid supply source 3210 may form a sealed inner space. In an embodiment, the treating liquid supply source 3210 may be provided as a tank in which the treating liquid is stored. Selectively, the treating liquid supply source 3210 may be provided as a reservoir. The treating liquid is stored in the inner space of the treating liquid supply source 3210. A supplementary line 3230 may be connected to the treating liquid supply source 3210.

The supplementary line 3230 may be connected to the treating liquid supply source 3210. In an embodiment, an end of the supplementary line 3230 may be connected to the supply source 3210, and the other end of the supplementary line 3230 may be connected to the circulation tank 3410 to be described later. The supplementary line 3230 may supply the treating liquid from the treating liquid supply source 3210 to the circulation tank 3410. In an embodiment, the supplementary line 3230 may supply the treating liquid to an accommodation space formed inside the circulation tank 3410. The pressure sensor 3250, the filter 3270, and the valve 3290 may be installed at the supplementary line 3230.

The pressure sensor 3250 measures a pressure in the supplementary line 3230. The pressure sensor 3250 measures the pressure of the treating liquid flowing inside the supplementary line 3230 in real time. A supply amount of the treating liquid flowing inside the supplementary line 3230 may be adjusted according to a pressure value measured by the pressure sensor 3250.

The filter 3270 may filter the treating liquid supplied from the supplementary line 3230. For example, the filter 3270 may filter the treating liquid supplied from the supply source 3210 to the circulation tank 3410. The filter 3270 may filter impurities that may be included in the treating liquid.

The valve 3290 may adjust an amount of the treating liquid supplied to the circulation tank 3410 through the supplementary line 3230. In an embodiment, the valve 3290 may be provided as an on-off valve to open and close the supplementary line 3230. Whether to supply the treating liquid to the accommodation space may be determined by opening and closing the valve 3290. In an embodiment, the valve 3290 may be installed downstream of the supplementary line 3230 than the filter 3270. However, the inventive concept is not limited thereto, and the valve 3290 may be installed upstream of the supplementary line 3230 than the filter 3270.

The circulation unit may include a circulation tank 3410, a circulation line 3430, a pump 3450, a heater 3470, and a circulation valve 3490. The circulation tank 3410 has an accommodation space in which the treating liquid is stored. The circulation tank 3410 may have a sealed accommodation space. The treating liquid is stored in the accommodation space of the circulation tank 3410. In an embodiment, the treating liquid supplied from the supply source 3210 may be stored in the accommodation space of the circulation tank 3410. The treating liquid stored in the circulation tank 3410 is a treating liquid heated to a set temperature by the heater 3470 to be described later. A measurement unit may be installed in the circulation tank 3410.

The measurement unit may measure a level of the treating liquid stored in the accommodation space of the circulation tank 3410. In an embodiment, the measurement unit may be provided as a pair of optical sensors consisting of a light receiving unit and a light emitting unit to detect a liquid level height of the treating liquid accommodated in the accommodation space.

In an embodiment, the measurement unit may include a first level sensor LL, a second level sensor L, a third level sensor M, a first supplementary level sensor MR-L, a second supplementary level sensor MR-H, a fourth level sensor H, and a limit level sensor HH. The first level sensor LL, the second level sensor L, the third level sensor M, the first supplementary level sensor MR-L, the second supplementary level sensor MR-H, the fourth level sensor H, and the limit level sensor HH may be sequentially disposed upwardly from a bottom surface of the accommodation space. The case in which six pairs of measurement units according to an embodiment of the inventive concept are provided has been described as an example, but the inventive concept is not limited thereto. The number and installation positions of the measurement units according to an embodiment of the inventive concept may be variously modified and provided according to process requirement conditions.

The first supplementary level sensor MR-L and the second supplementary level sensor MR-H may be combined to form a supplementary section MR which performs a supplementary operation to be described later. In an embodiment, if a level of the treating liquid stored in the accommodation space is positioned in the supplementary section MR, the treating liquid may be supplied to the accommodation space. Unlike this, if the level of the treating liquid stored in the accommodation space is positioned below a height of the second supplementary level sensor MR-H, a supplementary operation of supplying the treating liquid to the accommodation space may be performed. A detailed description of the supplementary operation will be described later.

The circulation line 3430 may be connected to the circulation tank 3410. For example, an end of the circulation line 3430 may be connected to a bottom end of the circulation tank 3410, and the other end of the circulation line 3430 may be connected to a top end of the circulation tank 3410. The circulation line 3430 circulates the treating liquid stored in the accommodation space of the circulation tank 3410. The treating liquid heated to a set temperature by the heater 3470 to be described later may flow through the circulation line 3430. A pump 3450, a heater 3470, and a circulation valve 3490 may be installed at the circulation line 3430.

The pump 3450 applies a pressure to circulate the treating liquid in the circulation line 3430 through the circulation line 3430. The pump 3450 provides a flow pressure so that the treating liquid is circulated from an end of the circulation line 3430 to the other end. According to an embodiment, the pump 3450 may be an impeller type pump. However, the inventive concept is not limited thereto, and may be provided as a bellows type pump which provides the pressure for circulating the treating liquid in the circulation line 3430. Unlike the above-described embodiment, the pump 3450 according to an embodiment of the inventive concept may be provided as various known pumps capable of providing the flow pressure.

The heater 3470 is installed in the circulation line 3430. The heater 3470 may be installed upstream of the circulation line 3430. The heater 3470 heats the treating liquid flowing inside the circulation line 3430. The heater 3470 may heat the treating liquid to a set temperature. At least one heater 3470 may be provided. The heater 3470 heats the treating liquid so that a temperature of the treating liquid flowing through the circulation tank 3410 and the circulation line 3430 is maintained at a set temperature. In an embodiment, the heater 3470 may continuously heat the treating liquid supplied to the accommodation space in the supplementary section described later so that the treating liquid is heated to a set temperature while passing through the circulation line 3430.

The circulation valve 3490 is installed at the circulation line 3430. For example, the circulation valve 3490 may be provided as an on-off valve for opening and closing the circulation line 3430. The circulation valve 3490 may open the circulation line 3430 to circulate the treating liquid in the circulation line 3430. The circulation valve 3490 may close the circulation line 3430 so that the treating liquid is not circulated in the circulation line 3430.

The supply unit may include a branch line 3610, a branch valve 3630, and a supply nozzle 3650. The branch line 3610 may be branched from the circulation line 3430. For example, an end of the branch line 3610 may be branched from the circulation line 3430, and the other end of the branch line 3610 may be connected to the supply nozzle 3650. A treating liquid heated to a set temperature may flow in the branch line 3610.

The branch valve 3630 may be installed in the branch line 3610. The branch valve 3630 may be provided as an on-off valve for opening and closing the branch line 3610. The branch valve 3630 may open the branch line 3610 to supply the treating liquid to the substrate W through the supply nozzle 3650. The branch valve 3630 may close the branch line 3610 to stop supplying the treating liquid to the substrate W.

The supply nozzle 3650 may supply the treating liquid to the substrate W. In an embodiment, the supply nozzle 3650 may supply a chemical heated to a set temperature to the substrate W. The supply nozzle 3650 may be moved by a driver (not shown).

Hereinafter, a substrate treating method according to an embodiment of the inventive concept will be described in detail. The substrate treating method described below may be performed by the liquid supply unit described above. In addition, the controller 30 described above can control the components of the liquid supply unit so that the liquid supply unit can perform the substrate treating method described below. For example, the controller 30 may generate a control signal for controlling at least one of the valve 3290, the measurement unit, and the heater 3470 so that the components of the liquid supply unit may perform the substrate treating method described below.

Hereinafter, for convenience of description, if a level of the treating liquid filled in the accommodation space is higher than a height of the fourth level sensor H, it is defined as an H section. In addition, if the level of the treating liquid stored in the accommodation space is positioned lower than a height of the second supplementary level sensor MR-H, it is defined as a supplementary section MR. According to an embodiment, if the level of the treating liquid stored in the accommodation space is positioned between the height of the second supplementary level sensor MR-H and a height of the first supplementary level sensor MR-L, it may be determined as a supplementary section MR which supplies the treating liquid to the accommodation space.

In the H section, a replenishment of the treating liquid in the accommodation space may be stopped, or an amount of the treating liquid supplemented in the accommodation space may be relatively minimized compared to the supplementary section MR. In the supplementary section MR, the treating liquid may be supplied to the accommodation space. In the supplementary section MR, a supplementary operation of supplying the treating liquid to the accommodation space may be performed. The supplementary operation may be divided into a first period and a second period.

The first period may be an initial period of supplying the treating liquid to the accommodation space. For example, the first period may be a period from a period of initially replenishing the treating liquid to an accommodation space to a preset time.

The second period may be performed after the first period. The second period may be a period from a preset time of the first period to a time at which the level of the treating liquid stored in the accommodation space is positioned higher than the height of the second supplementary level sensor MR-H. In an embodiment, the second period may be a period from the preset time of the first period until a time at which the level of the treating liquid stored in the accommodation space is positioned at a height corresponding to the height of the fourth level sensor H.

The first period may function as a buffer period. In the first period, the amount of the treating liquid supplied to the accommodation space may be relatively smaller than in the second period so that the temperature of the treating liquid stored in the accommodation space does not change rapidly. In an embodiment, a treating liquid supplied to the accommodation space per unit time during the first period may be a first supply amount. The first supply amount may mean an average supply amount of the treating liquid supplied to the accommodation space during the entire first period. A treating liquid supplied to the accommodation space per unit time during the second period may be a second supply amount. The second supply amount may mean an average supply amount of the treating liquid supplied to the accommodation space during the entire second period. An average supply amount per unit time of the treating liquid supplied to the accommodation space during the first period may be less than an average supply amount per unit time of the treating liquid supplied to the accommodation space during the second period.

Figure 4:
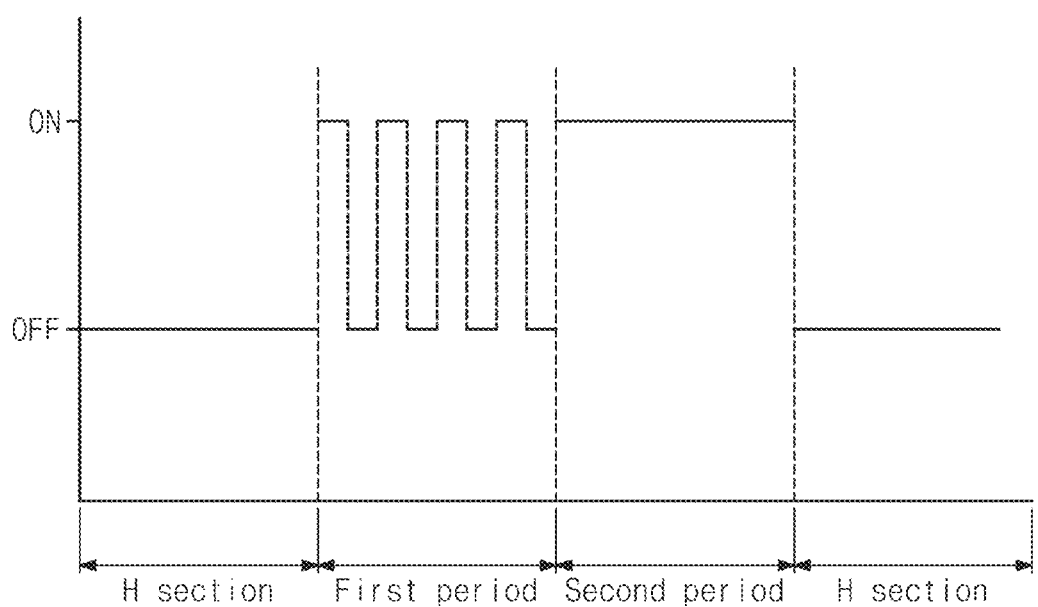
FIG. 4 schematically illustrates an on and off of a supply valve of FIG. 3 while performing a supplementary operation.
Figure 5:
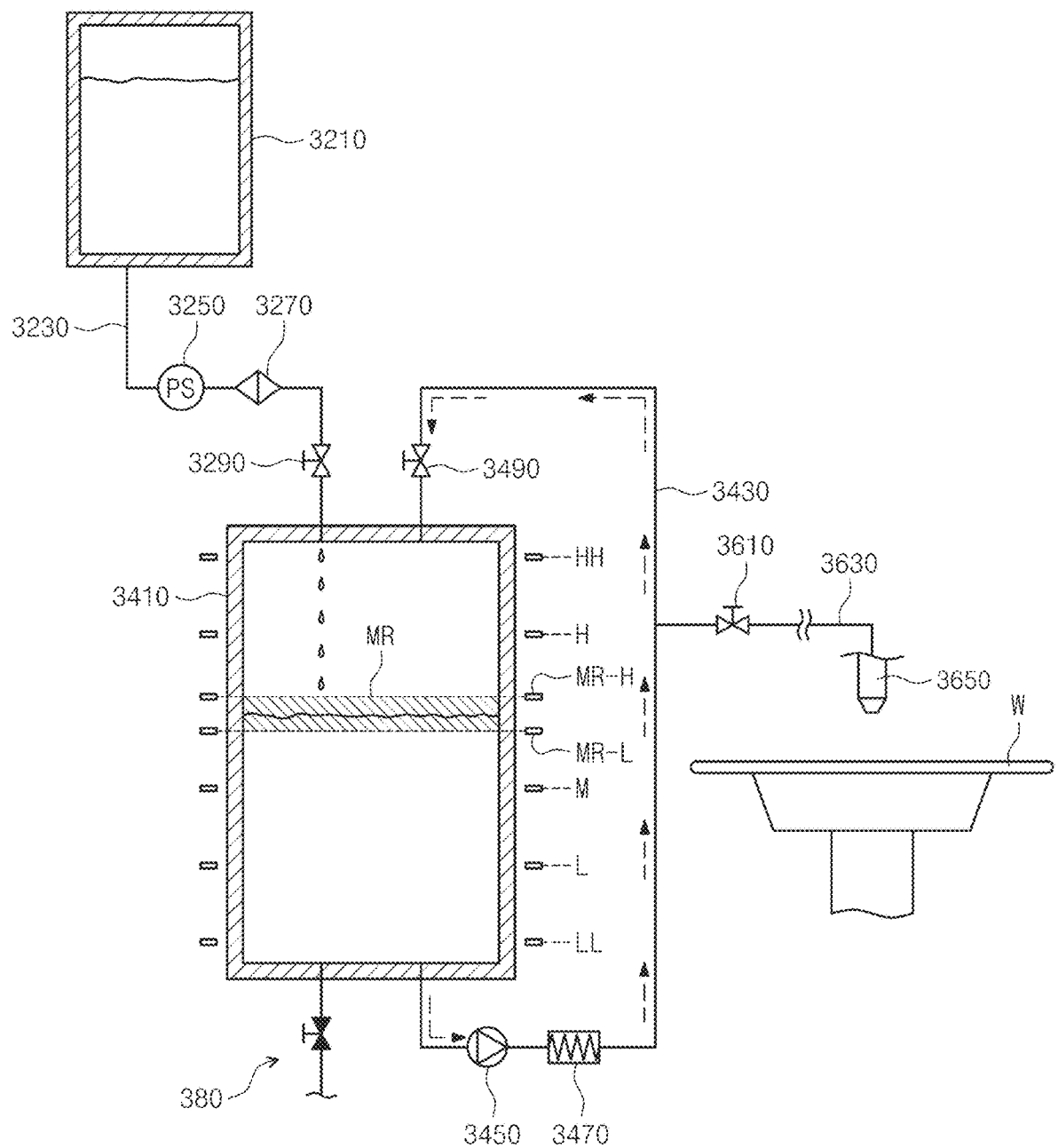
FIG. 5 schematically illustrates a state in which the liquid supply unit of FIG. 3 supplies a treating liquid to a tank at a first period.
Figure 6:
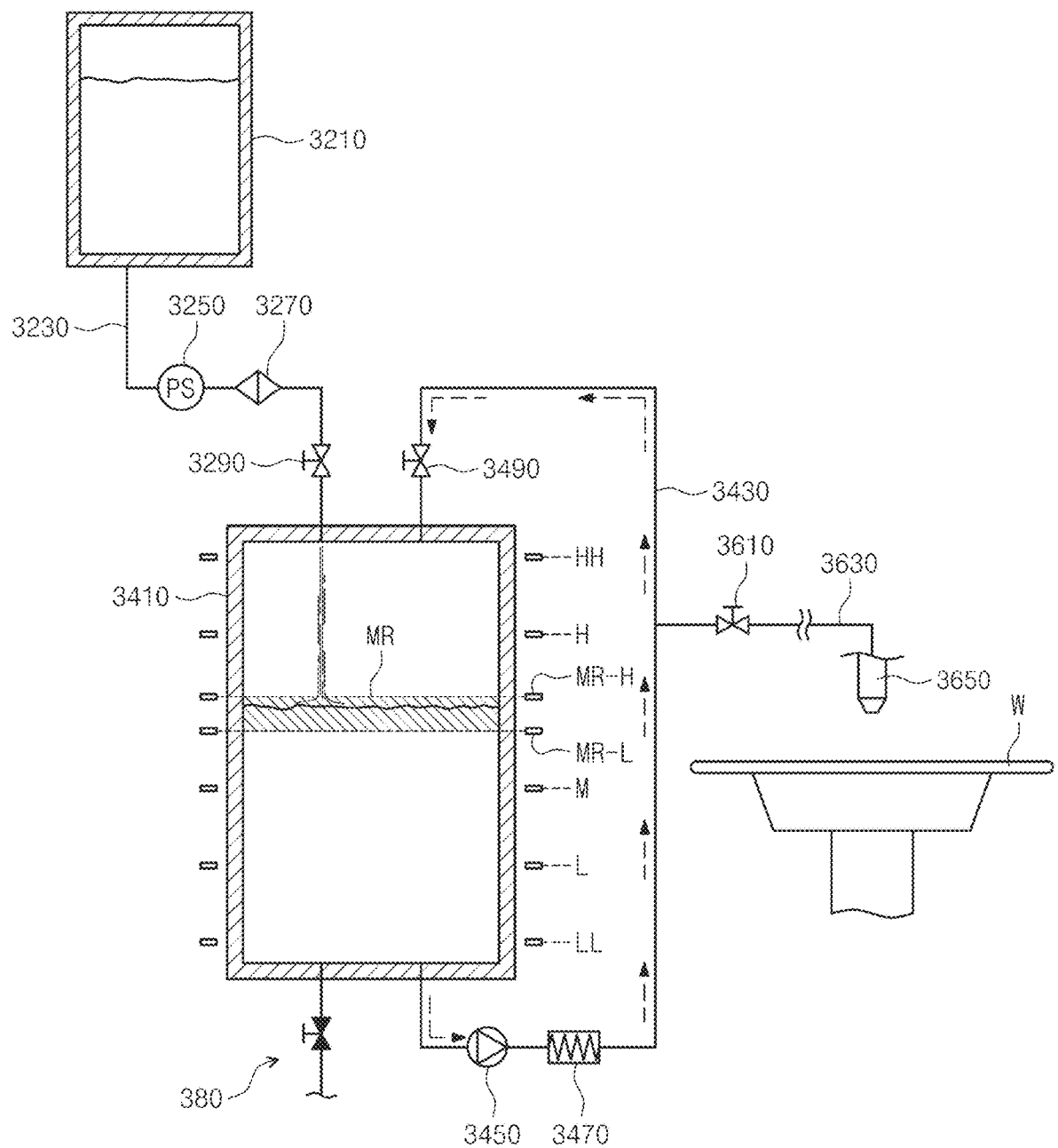
FIG. 6 schematically illustrates a state in which the liquid supply unit of FIG. 3 supplies the treating liquid to the tank at a second period.

FIG. 4 schematically illustrates on and off of the supply valve of FIG. 3 while performing a supplementary operation. FIG. 5 schematically illustrates a state in which the liquid supply unit of FIG. 3 supplies the treating liquid to the tank at the first period. FIG. 6 schematically illustrates a state in which the liquid supply unit of FIG. 3 supplies the treating liquid to the tank at the second period.

Referring to FIG. 4 to FIG. 6, the treating liquid is supplied from the treating liquid supply source 3210 to the accommodation space inside the circulation tank 3410 via the supplementary line 3230. The treating liquid stored in the accommodation space inside the circulation tank 3410 is circulated through the circulation line 3430. The treating liquid circulating through the circulation line 3430 is heated to a set temperature by the heater 3470. The treating liquid heated to the set temperature is discharged onto the substrate W through the branch line 3610 and then through the supply nozzle 3650.

If a process of discharging the treating liquid onto the substrate W is repeated, an amount of the treating liquid stored in the accommodation space inside the circulation tank 3410 may be reduced. If the treating liquid stored in the accommodation space of the circulation tank 3410 is positioned in the supplementary section MR, a supplementary operation of supplying the treating liquid to the accommodation space may be performed.

According to an embodiment, if the level of the treating liquid stored in the accommodation space is positioned between the height of the second supplementary level sensor MR-H and the height of the first supplementary level sensor MR-L, it may be determined as a supplementary section MR which supplies the treating liquid to the accommodation space. If the treating liquid stored in the accommodation space is positioned in the supplementary section MR, the supplementary operation may be performed.

Referring to FIG. 4, if the level of the treating liquid filled in the accommodation space is decreased from the H section to the supplementary section MR, the supplementary operation may be performed. The supplementary operation may be performed by opening or closing the valve 3290. The supplementary operation may be divided into a first period and a second period. The valve 3290 may perform a pulse operation of repeating the on and off operations during the first period of the supplementary operation. The valve 3290 may perform the on operation during the second period of the supplementary operation. In an embodiment, the valve 3290 may perform the off operation if the level of the treating liquid in the accommodation space is increased up to the H section outside the supplementary section MR. However, the inventive concept is not limited to it, and the valve 3290 can perform the on-operation until the level of the treating liquid in the accommodation space is filled up to the HH section.

Referring to FIG. 5, the valve 3290 may repeatedly perform the on and off operations at predetermined time intervals during the first period of the supplementary operation. That is, during the first period of the supplementary operation, the valve 3290 may perform a pulse operation. During the first period of the supplementary operation, an average supply amount per unit time of the treating liquid supplied to the accommodation space may be formed to be relatively lower than the second period. Referring to FIG. 6, during the second period of the supplementary operation, the valve 3290 may perform an on operation. During the second period of the supplementary operation, the average supply amount per unit time of the treating liquid supplied to the accommodation space may be formed to be relatively higher than the first period.

According to an embodiment of the inventive concept, even if the temperature of the treating liquid supplied from the treating liquid source 3210 is different from the set temperature, the temperature of the treating liquid previously stored in the circulation tank 3410 may be maintained within a set temperature range. That is, since the treating liquid maintained at the set temperature is stored inside the circulation tank 3410, the temperature of the treating liquid previously stored inside the circulation tank 3410 may change rapidly if the temperature of the treating liquid replenished inside the circulation tank 3410 deviates from the set temperature. According to an embodiment of the inventive concept, a temperature buffer section may be formed so that the temperature of the pre-stored treating liquid in the circulation tank 3410 does not change rapidly by minimizing an amount of the treating liquid initially supplied to the accommodation space in the circulation tank 3410.

In addition, by adjusting an average supply amount per unit time supplied at the first period of the supplementary operation by the pulse operation of the valve 3290, the temperature of the pre-stored treating liquid in the circulation tank 3410 can be maintained within a set temperature range. Accordingly, a time for the treating liquid flowing through the circulation line 3430 to be preheated at the heater 3470 to the set temperature may be reduced. In addition, by maintaining a constant temperature of the treating liquid within a set temperature range, an efficient liquid treatment may be performed on the substrate W.

The liquid supply unit in accordance with an embodiment of the inventive concept below is mostly provided similarly, except for the supplement unit among the descriptions of the liquid supply unit in accordance with an embodiment of the inventive concept. Accordingly, in order to prevent an overlapping of the contents, a description of the overlapping configuration will be omitted.

Figure 7:
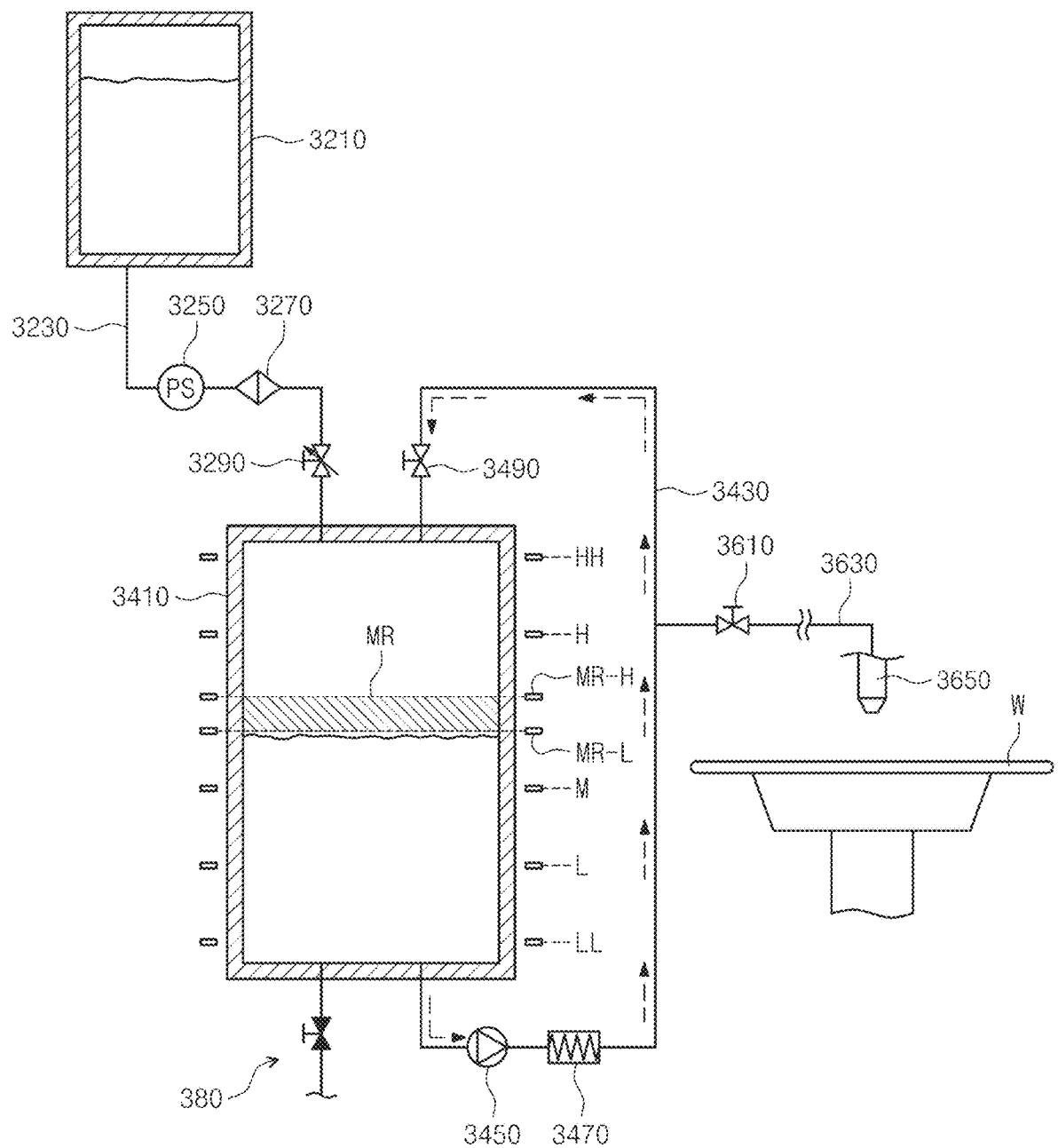
FIG. 7 schematically illustrates another embodiment of the liquid supply unit of FIG. 1.

FIG. 7 schematically illustrates another embodiment of the liquid supply unit of FIG. 1. Referring to FIG. 7, the supplementary unit may include a treating liquid supply source 3210, a supplementary line 3230, a pressure sensor 3250, a filter 3270, and a valve 3290. The treating liquid supply source 3210 may form a sealed inner space. In an embodiment, the treating liquid supply source 3210 may be provided as a tank in which the treating liquid is stored. Selectively, the treating liquid supply source 3210 may be provided as a reservoir. The treating liquid is stored in the inner space of the treating liquid supply source 3210. The supplementary line 3230 may be connected to the treating liquid supply source 3210.

The supplementary line 3230 may be connected to the treating liquid supply source 3210. For example, an end of the supplementary line 3230 may be connected to the supply source 3210, and the other end of the supplementary line 3230 may be connected to the circulation tank 3410 to be described later. The supplementary line 3230 may supply the treating liquid from the treating liquid supply source 3210 to the circulation tank 3410. In an embodiment, the supplementary line 3230 may supply the treating liquid to the accommodation space formed inside the circulation tank

3410. A pressure sensor 3250, a filter 3270, and a valve 3290 may be installed at the supplementary line 3230.

The pressure sensor 3250 measures the pressure in the supplementary line 3230. The pressure sensor 3250 measures the pressure of the treating liquid flowing inside the supplementary line 3230 in real time. The supply amount of the treating liquid flowing inside the supplementary line 3230 may be adjusted according to a pressure value measured by the pressure sensor 3250.

The filter 3270 may filter the treating liquid supplied from the supplementary line 3230. For example, the filter 3270 may filter the treating liquid supplied from the supply source 3210 to the circulation tank 3410. The filter 3270 may filter impurities that may be included in the treating liquid.

The valve 3290 may adjust the amount of the treating liquid supplied to the circulation tank 3410 through the supplementary line 3230. The valve 3290 may be provided as a flow rate control valve. In an embodiment, the valve 3290 may be provided as a static pressure valve based on an electric regulator. The electrical regulator may adjust a pneumatic pressure to control a pressure of the static pressure valve. However, the inventive concept is not limited thereto, and the valve 3290 according to an embodiment of the inventive concept may be provided as various known valves capable of adjusting a flow rate of a treating liquid flowing through the supplementary line 3230.

Figure 8:
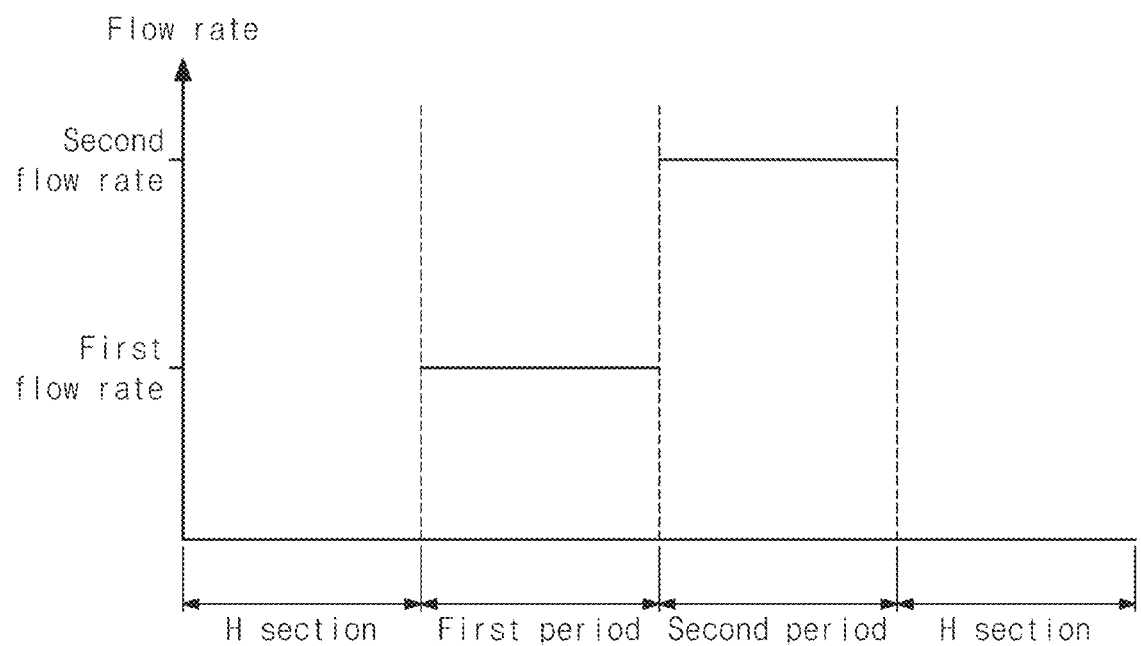
FIG. 8 and FIG. 9 schematically illustrate a flow rate of the supply valve of FIG. 7 while performing the supplementary operation.
Figure 9:
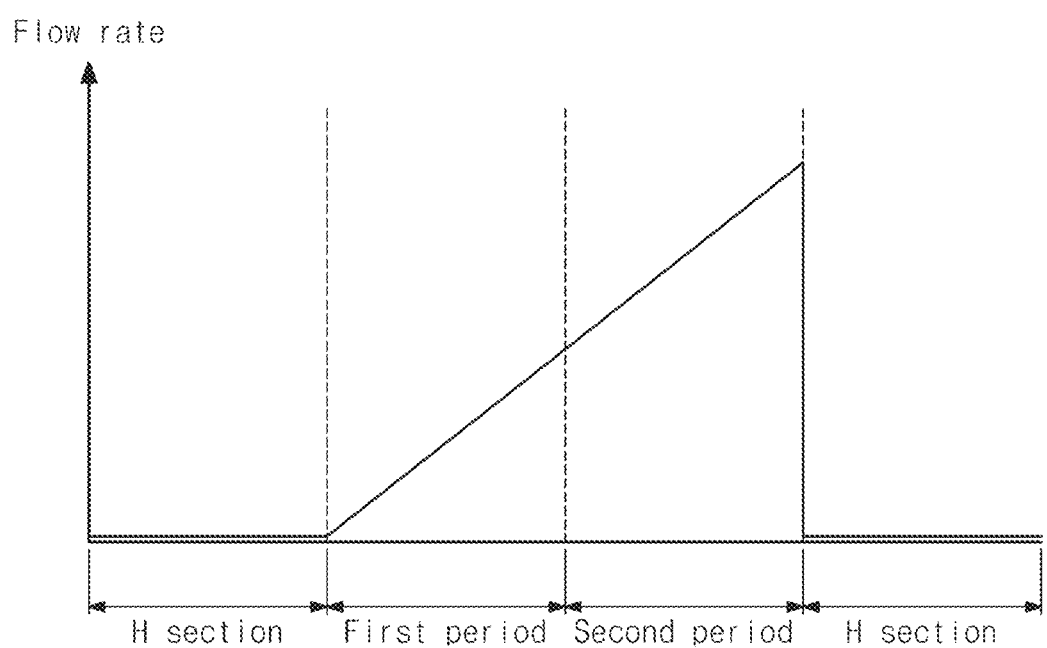

FIG. 8 and FIG. 9 schematically illustrate a flow rate of the supply valve of FIG. 7 while performing the supplementary operation. A substrate treating method according to an embodiment of the inventive concept will be described in detail with reference to FIG. 8 and FIG. 9.

Referring to FIG. 8 and FIG. 9, the treating liquid is supplied from the treating liquid supply source 3210 to the accommodation space inside the circulation tank 3410 via the supplementary line 3230. The treating liquid stored in the accommodation space inside the circulation tank 3410 is circulated through the circulation line 3430. The treating liquid circulating through the circulation line 3430 is heated to a set temperature by the heater 3470. The treating liquid heated to the set temperature is discharged onto the substrate W through the branch line 3610 and the supply nozzle 3650.

If the process of discharging the treating liquid onto the substrate W is repeated, an amount of the treating liquid stored in the accommodation space inside the circulation tank 3410 may be reduced. If the treating liquid stored in the accommodation space of the circulation tank 3410 is positioned in the supplementary section MR, the supplementary operation of supplying the treating liquid to the accommodation space may be performed.

According to an embodiment, if the level of the treating liquid stored in the accommodation space is positioned between the height of the second supplementary level sensor MR-H and the height of the first supplementary level sensor MR-L, it may be determined as the supplementary section MR which supplies the treating liquid to the accommodation space. If the treating liquid stored in the accommodation space is positioned in the supplementary section MR, the supplementary operation may be performed.

If the level of the treating liquid filled in the accommodation space is lowered from the H section to the supplementary section MR, the supplementary operation may be performed. The supplementary operation may be divided into a first period and a second period. The valve 3290 may supply the treating liquid to the accommodation space at a first flow rate during the first period of the supplementary operation as shown in FIG. 8. During the second period of the supplementary operation, the valve 3290 may supply the treating liquid to the accommodation space at a second flow rate, which has an average supply amount per unit time greater than the first flow rate. That is, the valve 3290 may adjust the average flow rate of the treating liquid per unit time supplied to the accommodation space in the first period and the second period.

Unlike the above-described example, the valve 3290 as illustrated in FIG. 9 may increase the average supply amount of the treating liquid per unit time supplied to the accommodation space from the first period to the second period of the supplementary operation. In an embodiment, as time passes from the first period to the second period of the supplementary operation, the average flow rate per unit time of the treating liquid supplied to the accommodation space may be gradually increased.

If the level of the treating liquid of the accommodation space increases to the H section which is outside the supplementary section MR, the valve 3290 may lower the average supply amount of the treating liquid per unit time supplied to the accommodation space to be lower than the average supply amount per unit time of the treating liquid supplied in the first period. Selectively, if the level of the treating liquid in the accommodation space increases to the H section outside the supplementary section MR, the valve 3290 may close the supplementary line 3230 so a supply of the treating liquid to the accommodation space is stopped. Also, it is not limited to the above-described example, and the above-described operation may be performed until the level of the treating liquid in the accommodation space reaches the HH section.

According to an embodiment of the inventive concept, even if the temperature of the treating liquid supplied from the treating liquid supply source 3210 is different from the set temperature, the temperature of the treating liquid previously stored in the circulation tank 3410 may be maintained within the set temperature range. That is, since the treating liquid maintained at the set temperature is stored inside the circulation tank 3410, the temperature of the treating liquid previously stored inside the circulation tank 3410 may change rapidly if the temperature of the treating liquid replenished inside the circulation tank 3410 deviates from the set temperature. According to an embodiment of the inventive concept, a temperature buffer section may be formed so that a temperature of the pre-stored treating liquid in the circulation tank 3410 does not change rapidly by minimizing an amount of the treating liquid initially supplied to the accommodation space in the circulation tank 3410.

By adjusting an average flow rate of the valve 3290 per time unit to be lower than an average supply amount per unit time of the treating liquid supplied to the accommodation space at the first period of the supplementary operation, the temperature of the treating liquid stored in the circulation tank 3410 can be maintained within a set temperature range. Accordingly, a time for the treating liquid flowing through the circulation line 3430 to be preheated to the set temperature may be reduced by the heater 3470. In addition, by maintaining a constant temperature of the treating liquid within the set temperature range, an efficient liquid treatment on the substrate W may be performed.

The liquid supply unit in accordance with an embodiment of the inventive concept is mostly provided similarly, except for the supplement unit among the descriptions of the liquid supply unit in accordance with an embodiment of the inventive concept. Accordingly, in order to prevent an overlapping of the contents, a description of the overlapping configuration will be omitted.

Figure 10:
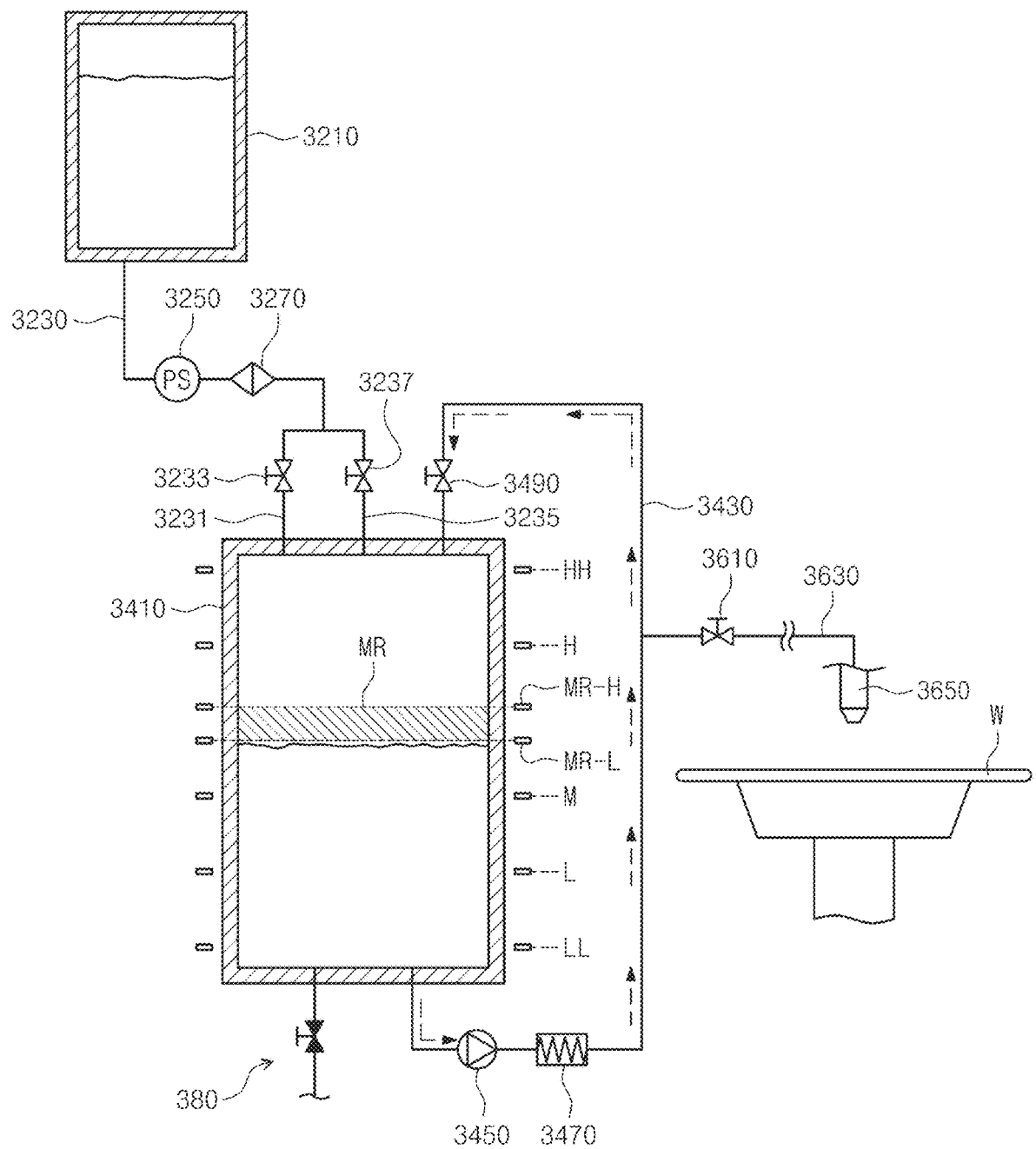
FIG. 10 schematically illustrates another embodiment of the liquid supply unit of FIG. 1.

FIG. 10 schematically illustrates another embodiment of the liquid supply unit of FIG. 1. Referring to FIG. 10, the supplementary unit may include a treating liquid supply source 3210, a supplementary line 3230, a pressure sensor 3250, and a filter 3270. The treating liquid supply source 3210 may form a sealed inner space. In an embodiment, the treating liquid supply source 3210 may be provided as a tank in which the treating liquid is stored. Selectively, the treating liquid supply source 3210 may be provided as a reservoir. The treating liquid is stored in the inner space of the treating liquid supply source 3210. The supplementary line 3230 may be connected to the treating liquid supply source 3210.

The supplementary line 3230 may connect the treating liquid supply source 3210 and the circulation tank 3410. An end of the supplementary line 3230 may be connected to the treating liquid supply source 3210. The other end of the supplementary line 3230 may be branched. The other end of the supplementary line 3230 may be branched into the first pipe 3231 and the second pipe 3235.

An end of the first pipe 3231 may be connected to the supplementary line 3230, and the other end of the first pipe 3231 may be connected to the circulation tank 3410. The first pipe 3231 may have a first diameter. A first valve 3233 may be installed at the first pipe 3231. The first valve 3233 may be provided as an on-off valve. However, the inventive concept is not limited thereto, and the first valve 3233 may be provided as a flow rate control valve. A diameter of the first valve 323 through which the treating liquid flows in the first valve 3233 may be provided as a third diameter. A flow rate coefficient of the first valve 323 may have a first flow rate coefficient. The first pipe 3231 and the first valve 3233 may constitute a first supply member. The treating liquid may be supplied from the treating liquid supply source 3210 to the accommodation space inside the circulation tank 3410 through the supplementary line 3230 and the first supply member.

An end of the second pipe 3235 may be connected to the supplementary line 3230, and the other end of the second pipe 3235 may be connected to the circulation tank 3410. The second pipe 3235 may have a second diameter greater than the first diameter of the first pipe 3231. A second valve 3237 may be installed in the second pipe 3235. The second valve 3237 may be provided as an on-off valve. However, the inventive concept is not limited thereto, and the second valve 3237 may be provided as a flow rate control valve. The diameter of the second valve 3237 through which the treating liquid flows may be provided as a fourth diameter which is larger than the third diameter of the first valve 3231. The second valve 3237 may have a second flow rate coefficient greater than the first flow rate coefficient of the first valve 3233. The second pipe 3235 and the second valve 3237 may constitute a second supply member. The treating liquid may be supplied from the treating liquid supply source 3210 to the accommodation space inside the circulation tank 3410 through the supplementary line 3230 and the second supply member.

The pressure sensor 3250 may be installed in the supplementary line 3230. The pressure sensor 3250 measures the pressure in the supplementary line 3230. The pressure sensor 3250 measures the pressure of the treating liquid flowing inside the supplementary line 3230 in real time. The supply amount of the treating liquid flowing inside the supplementary line 3230 may be adjusted according to the pressure value measured by the pressure sensor 3250.

The filter 3270 may be installed at the supplementary line 3230. The filter 3270 may filter the treating liquid supplied from the supplementary line 3230. For example, the filter 3270 may filter the treating liquid supplied from the supply source 3210 to the circulation tank 3410. The filter 3270 may filter impurities that may be included in the treating liquid.

Figure 11:
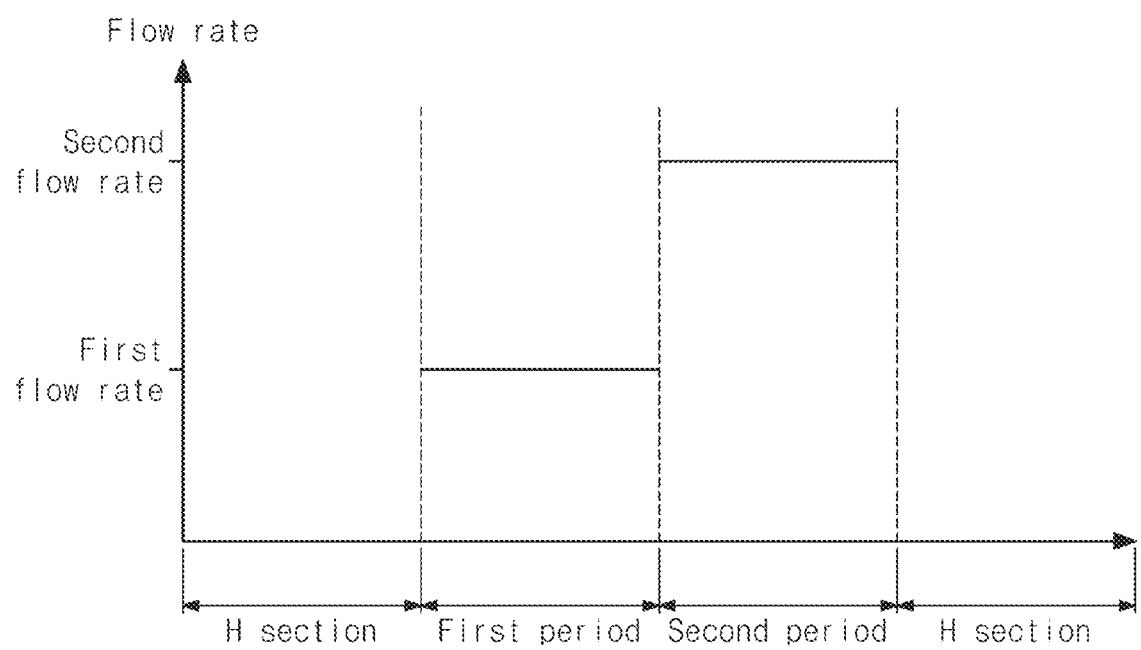
FIG. 11 schematically illustrates the flow rate supplied from a first supply member and a second supply member of FIG. 10 while performing the supplementary operation.
Figure 11:
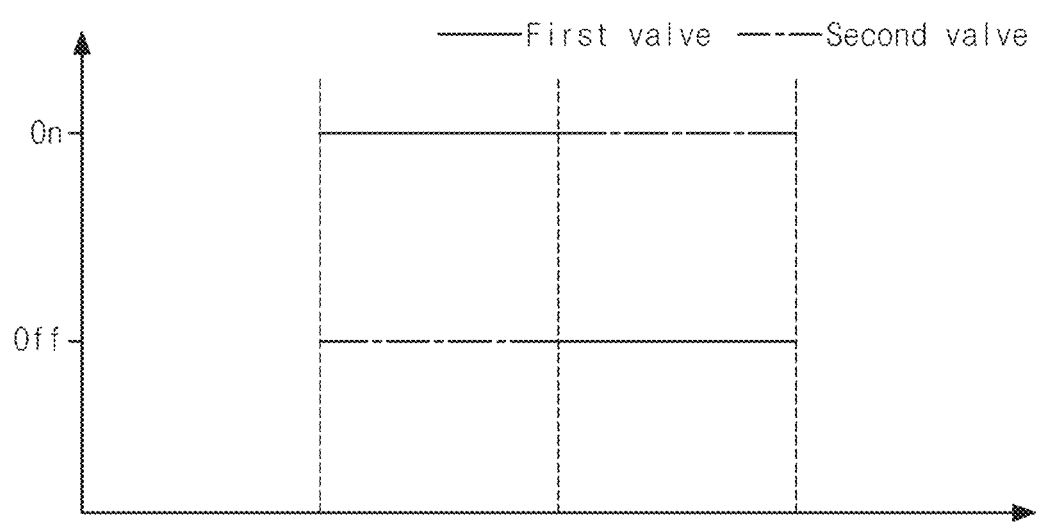
Figure 12:
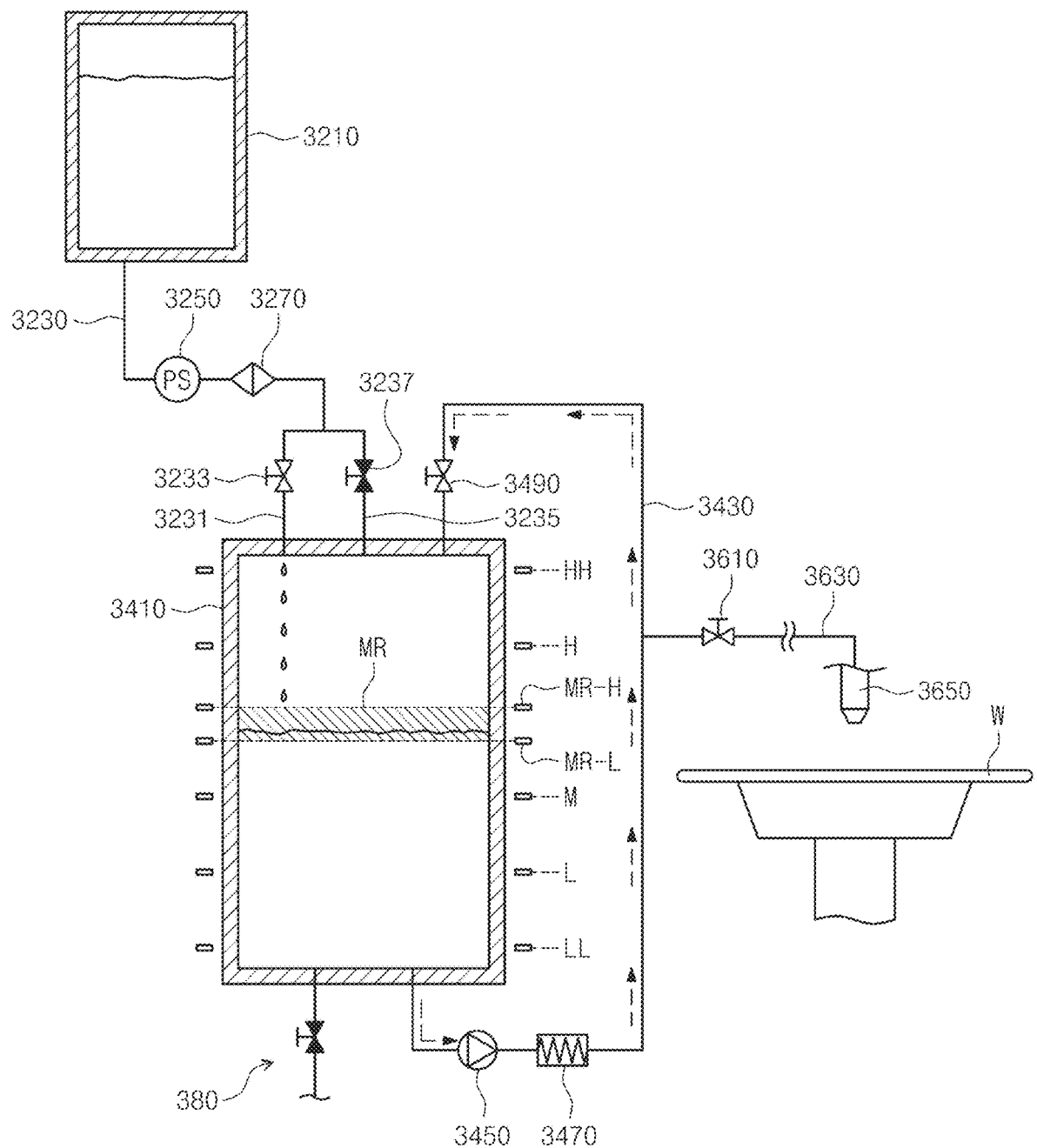
FIG. 12 schematically illustrates a state in which the liquid supply unit of FIG. 10 supplies the treating liquid to the tank at the first period.
Figure 13:
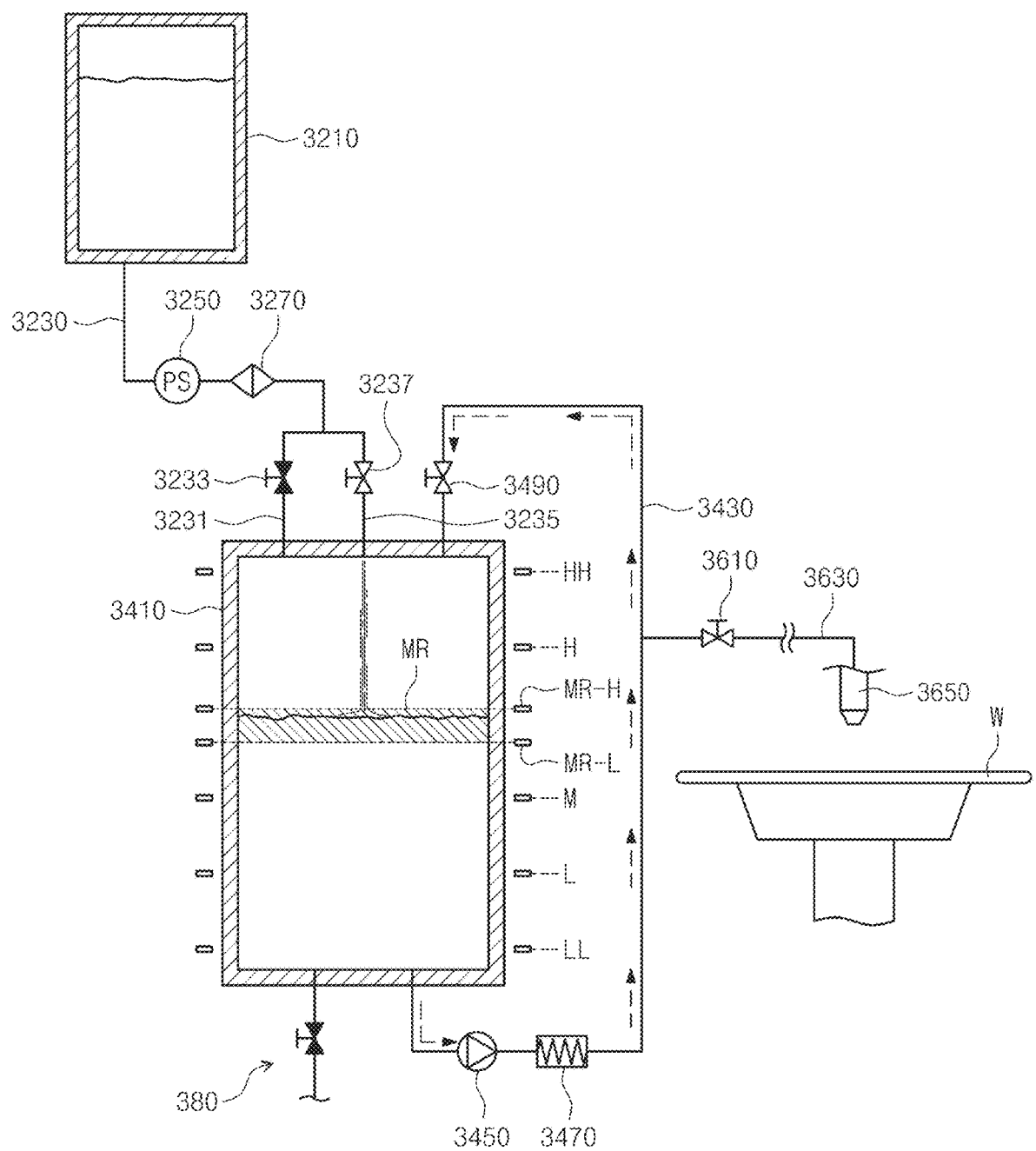
FIG. 13 schematically illustrates a state in which the liquid supply unit of FIG. 10 supplies the treating liquid to the tank at the second period.

FIG. 11 schematically illustrates a flow rate supplied from the first supply member and the second supply member of FIG. 10 while performing the supplementary operation. FIG. 12 schematically illustrates a state in which the liquid supply unit of FIG. 10 supplies the treating liquid to the tank at the first period. FIG. 13 schematically illustrates a state in which the liquid supply unit of FIG. 10 supplies the treating liquid to the tank at the second period. A substrate treating method according to an embodiment of the inventive concept will be described in detail with reference to FIG. 11 to FIG. 13.

Referring to FIG. 11 to FIG. 13, the treating liquid is supplied from the treating liquid supply source 3210 to the accommodation space inside the circulation tank 3410 via the supplementary line 3230. In an embodiment, the treating liquid is supplied from the treating liquid supply source 3210 to the accommodation space inside the circulation tank 3410 through the first pipe 3231 or/and the second pipe 3235 branched from the supplementary line 3230. The treating liquid stored in the accommodation space inside the circulation tank 3410 is circulated through the circulation line 3430. The treating liquid circulating through the circulation line 3430 is heated to the set temperature by the heater 3470. The treating liquid heated to the set temperature is discharged onto the substrate W through the branch line 3610 and then the supply nozzle 3650.

If a process of discharging the treating liquid onto the substrate W is repeated, an amount of the treating liquid stored in the accommodation space inside the circulation tank 3410 may be reduced. If the treating liquid stored in the accommodation space of the circulation tank 3410 is positioned in the supplementary section MR, a supplementary operation of supplying the treating liquid to the accommodation space may be performed.

According to an embodiment, if the level of the treating liquid stored in the accommodation space is positioned between the height of the second supplementary level sensor MR-H and the height of the first supplementary level sensor MR-L, it may be determined as a supplementary section MR that supplies the treating liquid to the accommodation space. If the treating liquid stored in the accommodation space is positioned in the supplementary section MR, the supplementary operation may be performed.

If the level of the treating liquid filled in the accommodation space is lowered from the H section to the supplementary section MR, the supplementary operation may be performed. The supplementary operation may be divided into a first period and a second period. As shown in FIG. 11, the first valve 3233 may be opened and the second valve 3237 may be closed at the first period of the supplementary operation. Accordingly, the treating liquid is supplied to the accommodation space through the first pipe 3231. In the first period, an average supply amount per unit time of the treating liquid supplied to the accommodation space from the first valve 3233 may be a first flow rate.

At the second period of the supplementary operation, the first valve 323 may be closed and the second valve 3237 may be opened. Accordingly, in the second period, the treating liquid may flow to the accommodation space through the second pipe 3235. In the second period, the average supply amount per unit time of the treating liquid supplied from the second valve 3237 to the accommodation space may be a second flow rate higher than the first flow rate.

According to an embodiment of the inventive concept, even if the temperature of the treating liquid supplied from the treating liquid supply source 3210 is different from the set temperature, the temperature of the treating liquid previously stored in the circulation tank 3410 may be maintained within the set temperature range. That is, since the treating liquid maintained at the set temperature is stored inside the circulation tank 3410, the temperature of the treating liquid previously stored inside the circulation tank 3410 may change rapidly if the temperature of the treating liquid replenished inside the circulation tank 3410 deviates from the set temperature. According to an embodiment of the inventive concept, a temperature buffer section may be formed so that the temperature of the pre-stored treating liquid in the circulation tank 3410 does not change rapidly by minimizing the amount of the treating liquid initially supplied to the accommodation space in the circulation tank 3410.

Accordingly, the temperature of the treating liquid pre-stored in the circulation tank 3410 may be maintained within the set temperature range. A time for the treating liquid flowing through the circulation line 3430 to be preheated to the set temperature may be reduced by the heater 3470. In addition, by maintaining a constant temperature of the treating liquid within a set temperature range, an efficient liquid treatment on the substrate W may be performed.

In the above-described embodiment of the inventive concept, for convenience of explanation, a case in which the first valve 3233 and the second valve 3237 are provided as on-off valves has been described as an example. However, the inventive concept is not limited thereto, and the first valve 3233 and the second valve 3237 are provided as flow control valves to form a temperature buffer section by forming a flow rate of the treating liquid supplied to the accommodation space through the first valve 3233 in the first period lower than a flow rate of the treating liquid supplied to the accommodation space through the second valve 3237 in the second period.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a support unit configured to support a substrate; and
   a liquid supply unit configured to supply a treating liquid onto the substrate supported on the support unit, and
   wherein the liquid supply unit comprises:
   a tank configured to have an accommodation space for storing the treating liquid therein;
   a circulation line configured to circulate the treating liquid stored in the accommodation space;
   a supplementary line configured to supply the treating liquid to the accommodation space, and at which a valve is installed;
   a heater installed at the circulation line, and configured to heat the treating liquid; and
   a controller configured to control the valve, and
   wherein the controller is configured to control the valve to perform a supplementary operation of supplying the treating liquid to the accommodation space through the supplementary line upon determining that a supplement of the treating liquid stored in the accommodation space is required, to control the valve to supply the treating liquid at a first average supply amount per unit time to the accommodation space while a first period of the supplementary operation is being performed, the first average supply amount averaged over an entirety of the first period, and to control the valve to supply the treating liquid at a second average supply amount per unit time to the accommodation space while a second period of the supplementary operation is being performed, the second average supply amount averaged over an entirety of the second period and different from the first average supply amount and
   the first period happens before the second period.

2. The substrate treating apparatus of claim 1, wherein the first average supply amount per unit time is lower than the second average supply amount per unit time.

3. The substrate treating apparatus of claim 2, wherein the controller is configured to control the valve to perform a pulse operation of repeating an on operation and an off operation during the first period.

4. The substrate treating apparatus of claim 2, wherein the controller is configured to control the valve to perform a pulse operation of repeating an on operation during the first period.

5. The substrate treating apparatus of claim 2, wherein the supplementary line branches to flow the treating liquid to a first supply member and a second supply member which each have a valve and a pipe, and
   a size of the valve or the pipe provided at the first supply member and the second supply member are different.

6. The substrate treating apparatus of claim 5, wherein a size of a first valve and a first pipe provided at the first supply member is relatively smaller than a size of a second valve and a second pipe provided at the second supply member.

7. The substrate treating apparatus of claim 6, wherein the controller controls the first valve to be on and the second valve to be off so the treating liquid is supplied to the accommodation space through the first supply member during the first period, and
   controls the second valve to be on during the second period.

8. The substrate treating apparatus of claim 2, wherein the valve is a flow rate adjusting valve.

9. The substrate treating apparatus of claim 1 further comprising:
   a measurement unit configured to measure a level of the treating liquid stored at the accommodation space, and
   wherein the controller is configured to determine a supplementary section at which the supplementary operation is performed by detecting the level of the treating liquid stored at the accommodation space measured by the measurement unit.

10. The substrate treating apparatus of claim 1, wherein the heater is configured to continuously heat the treating liquid stored at the accommodation space during a supplementary operation.

11. A liquid supply unit configured to supply a treating liquid onto a substrate comprising:
    a tank configured to have an accommodation space for storing the treating liquid therein;

a circulation line configured to circulate the treating liquid stored in the accommodation space;

a supplementary line configured to supply the treating liquid to the accommodation space, and at which a valve is installed;

a heater installed at the circulation line, and configured to heat the treating liquid; and a controller configured to control the valve, and wherein the controller is configured to control the valve to perform a supplementary operation of supplying the treating liquid to the accommodation space through the supplementary line upon determining that a supplement of the treating liquid stored in the accommodation space is required, to control the valve to supply the treating liquid at a first average supply amount per unit time to the accommodation space while a first period of the supplementary operation is being performed, the first average supply amount averaged over an entirety of the first period, and to control the valve to supply the treating liquid at a second average supply amount per unit time to the accommodation space while a second period of the supplementary operation is being performed, the second average supply amount averaged over an entirety of the second period and different from the first average supply amount, and the first period happens before the second period.

12. The liquid supply unit of claim 11, wherein the controller is configured to control the valve to perform a pulse operation of repeating an on operation and an off operation during the first period, and to control the valve to perform a pulse operation of repeating an on operation during the first period.

13. The liquid supply unit of claim 11, wherein an average supply amount per unit time of the treating liquid supplied during the first period is lower than an average supply amount per unit time of the treating liquid supplied at the second period.

14. The liquid supply unit of claim 13, wherein the supplementary line branches to flow the treating liquid to a first supply member and a second supply member which each have a valve and a pipe, and a size of a first valve and a first pipe provided at the first supply member is relatively smaller than a size of a second valve and a second pipe provided at the second supply member.

15. The liquid supply unit of claim 14, wherein the controller controls the first valve to be on and the second valve to be off so the treating liquid is supplied to the accommodation space through the first supply member during the first period, and controls the second valve to be on during the second period.

16. The liquid supply unit of claim 12, wherein the valve is a flow rate adjusting valve.

17. A substrate treating apparatus comprising:

a support unit configured to support a substrate; and a liquid supply unit configured to supply a treating liquid onto the substrate supported on the support unit, and wherein the liquid supply unit comprises:

a tank configured to have an accommodation space for storing the treating liquid therein;

a circulation line configured to circulate the treating liquid stored in the accommodation space;

a supplementary line configured to supply the treating liquid to the accommodation space, and at which a valve is installed; and a controller configured to control the valve, and wherein the controller is configured to control the valve to perform a supplementary operation of supplying the treating liquid to the accommodation space through the supplementary line upon determining that a supplement of the treating liquid stored in the accommodation space is required, to control the valve to supply the treating liquid at a first average supply amount per unit time to the accommodation space while a first period of the supplementary operation is being performed, the first average supply amount averaged over an entirety of the first period, and to control the valve to supply the treating liquid at a second average supply amount per unit time to the accommodation space while a second period of the supplementary operation is being performed, the second average supply amount averaged over an entirety of the second period and greater than the first average supply amount.

18. The substrate treating apparatus of claim 17, wherein the valve is configured to pulse on and off during the first period.

19. The substrate treating apparatus of claim 17, wherein the valve is configured to be on during the entirety of the second period.

20. The substrate treating apparatus of claim 17, wherein the valve is configured to be off right before a start of the first period and to be on right at the end of the second period.

* * * * *